US012640177B2

(12) United States Patent (10) Patent No.: US 12,640,177 B2
Kim et al. (45) Date of Patent: May 26, 2026

(54) STORAGE DEVICE AND DATA TRAINING METHOD THEREOF

(71) Applicant: Samsung Electronics Co., Ltd., Suwon-si (KR)

(72) Inventors: Tongsung Kim, Suwon-si (KR); Seonkyoo Lee, Suwon-si (KR); Seungjun Bae, Suwon-si (KR); Taesung Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 207 days.

(21) Appl. No.: 18/392,199

(22) Filed: Dec. 21, 2023

(65) Prior Publication Data

US 2024/0212729 A1 Jun. 27, 2024

(30) Foreign Application Priority Data

Dec. 21, 2022 (KR) ........................ 10-2022-0180585

(51) Int. Cl.
G11C 7/10 (2006.01)
G11C 7/22 (2006.01)
(52) U.S. Cl.
CPC ............ G11C 7/222 (2013.01); G11C 7/1066 (2013.01)
(58) Field of Classification Search
CPC ..... G11C 7/222; G11C 7/1066; G11C 29/022; G11C 2029/0407; G11C 7/1051; G11C 7/1093; G11C 29/023; G11C 29/028; G11C 29/12015; G11C 29/50012; G11C 2207/2254; G06F 3/0611; G06F 3/0619; G06F 3/0658; G06F 3/0604; G06F 3/061; G06F 3/0614; G06F 2212/1016; G06F 2212/1032
See application file for complete search history.

(56) References Cited

U.S. PATENT DOCUMENTS

| | | | |
|---|---|---|---|
| 7,036,053 B2 | 4/2006 | Zumkehr et al. | |
| 9,043,586 B2 | 5/2015 | Cox, Jr. et al. | |
| 9,811,273 B1 | 11/2017 | Brahmadathan | |
| 10,403,375 B2 * | 9/2019 | Lee ..................... | G06F 13/1689 |
| 10,607,672 B2 | 3/2020 | Shin et al. | |
| 11,200,941 B2 | 12/2021 | Park | |
| 11,392,324 B2 | 7/2022 | Na et al. | |
| 2019/0122745 A1 | 4/2019 | Kim et al. | |
| 2019/0355399 A1 | 11/2019 | Hwang | |
| 2020/0143854 A1 | 5/2020 | Kim et al. | |
| 2022/0189521 A1 | 6/2022 | Hwang | |
| 2022/0269419 A1 | 8/2022 | Kim | |

FOREIGN PATENT DOCUMENTS

KR 10-2021-0041357 A 4/2021

OTHER PUBLICATIONS

Extended European Search Report dated May 29, 2024 in European Application No. 23218768.2.

* cited by examiner

*Primary Examiner* — Xiaochun L Chen

(74) *Attorney, Agent, or Firm* — Harness, Dickey & Pierce, P.L.C.

(57) ABSTRACT

A storage device includes a first chip and a second chip configured to exchange data with the first chip. The first chip may transmit a data strobe signal and a plurality of data signals, applied with different delay times, to the second chip. The second chip may sample the plurality of data signals, applied with the different delay times, using the data strobe signal received from the first chip during data training.

19 Claims, 24 Drawing Sheets

STORAGE DEVICE AND DATA TRAINING METHOD THEREOF

CROSS-REFERENCE TO RELATED APPLICATION(S)

This application claims benefit of priority to Korean Patent Application No. 10-2022-0180585, filed on Dec. 21, 2022, in the Korean Intellectual Property Office, the disclosure of which is incorporated herein by reference in its entirety.

BACKGROUND

The present disclosure relates to a storage device and a data training method thereof.

Memory devices are used to store data and are classified into volatile memory devices and nonvolatile memory devices. A flash memory device, a type of nonvolatile memory device, may be used in mobile phones, digital cameras, mobile computer devices, stationary computer devices, and/or other like devices.

A controller and a memory device may communicate with each other through a channel or data input/output lines. Training may be performed to improve integrity of data transmission between the controller and the memory device. Training is intended to improve the integrity of data transmission, and may include aligning transmission or arrival timings of data signals transmitted in parallel. However, with an increase in operating speed required in recent years, it may become difficult to ensure reliability of data. Accordingly, a larger amount of time is required for training.

SUMMARY

Example embodiments provide a storage device, capable of performing a training operation at high speed.

According to at least one example embodiment, a storage device includes a first chip and a second chip configured to exchange data with the first chip. The first chip may be configured to transmit a data strobe signal and a plurality of data signals to the second chip such that different delay times are applied to each of the plurality of data signals. The second chip may be configured to, during data training, sample the plurality of data signals using the data strobe signal received from the first chip.

According to at least one example embodiment, a transmitter configured to support data training includes a first delay cell configured to generate a first delayed data signal by applying a first delay time to a first data signal, a first pad configured to transmit the first delayed data signal, a second delay cell configured to generate a second delayed data signal by applying a second delay time, longer than the first delay time, to a second data signal, a second pad configured to transmit the second delayed data signal, a third delay cell configured to generate a third delayed data signal by applying a third delay time, longer than the second delay time, to a third data signal, a third pad configured to transmit the third delayed data signal, a fourth pad configured to transmit a data strobe signal, and a processing circuitry configured to a determine a data strobe signal (DQS) delay time for the data strobe signal based on a result of sampling at least the first to third delayed data signals received from a receiver.

According to at least one example embodiment, a receiver configured to support data training includes a first pad configured to receive a first delayed data signal, a first sampler configured to receive the first delayed data signal from the first pad, a second pad configured to receive a second delayed data signal, a second sampler configured to receive the second delayed data signal from the second pad, the second delayed data signal having a delay time different from a delay time of the first delayed data signal, and a third pad configured to receive a data strobe signal from an external entity. The first sampler may be configured to sample the first delayed data signal using the data strobe signal, and the second sampler may be configured to sample the second delayed data signal using the data strobe signal.

According to at least one example embodiment, a storage device includes a controller and a memory device configured to exchange data with the controller and comprising an interface circuit and a plurality of nonvolatile memories. The controller may be configured to transmit a plurality of first data signals and a first data strobe signal to the interface circuit during first data training, each of the plurality of first data signals applied with a different delay time, the interface circuit may be configured to transmit a plurality of second data signals and a second data strobe signal to the plurality of nonvolatile memories during second data training, each of the plurality of second data signals applied with a different delay time, and a frequency of the second data strobe signal may be lower than a frequency of the first data strobe signal.

According to at least one example embodiment, a data training method between a transmitter and a receiver configured to exchange data includes transmitting a data strobe signal and a plurality of data signals from the transmitter to the receiver such that different delay times are applied to each of the plurality of data signals, sampling, by the receiver, the plurality of data signals using the data strobe signal, and determining a data strobe signal (DQS) delay time, corresponding to the data strobe signal, based on a result of the sampling.

According to at least one example embodiment, a data training method between a transmitter and a receiver configured to exchange data includes transmitting a data strobe signal and a plurality of first data signals from the transmitter to the receiver such that different course delay times are applied to the plurality of first data signals, sampling, by the receiver, the first data signals using the data strobe signal, determining a coarse data strobe signal (DQS) delay time, corresponding to the data strobe signal, based on a result of the sampling of the first data signals, transmitting the data strobe signal and a plurality of second data signals from the transmitter to the receiver such that different fine delay times are applied to the plurality of second data signals, sampling, by the receiver, the second data signals using the data strobe signal, and determining a fine DQS delay time, corresponding to the data strobe signal, based on a result of the sampling of the second data signals.

BRIEF DESCRIPTION OF DRAWINGS

The above and other aspects, features, and advantages of the present disclosure will be more clearly understood from the following detailed description, taken in conjunction with the accompanying drawings.

FIG. 1 is a schematic block diagram illustrating an example of a storage device according to some example embodiments.

FIG. 10 is a diagram illustrating an example of the storage device of FIG. 1.

FIG. 12 is a diagram illustrating another example of the storage device of FIG. 1.

FIG. 13 is a block diagram illustrating an example of a system-on-chip of FIG. 12.

FIG. 15 is a diagram illustrating another example of the storage device of FIG. 1.

FIG. 16 is a diagram provided to describe data training between a controller and an interface circuit in the storage device of FIG. 15.

DETAILED DESCRIPTION

Figure 2A:
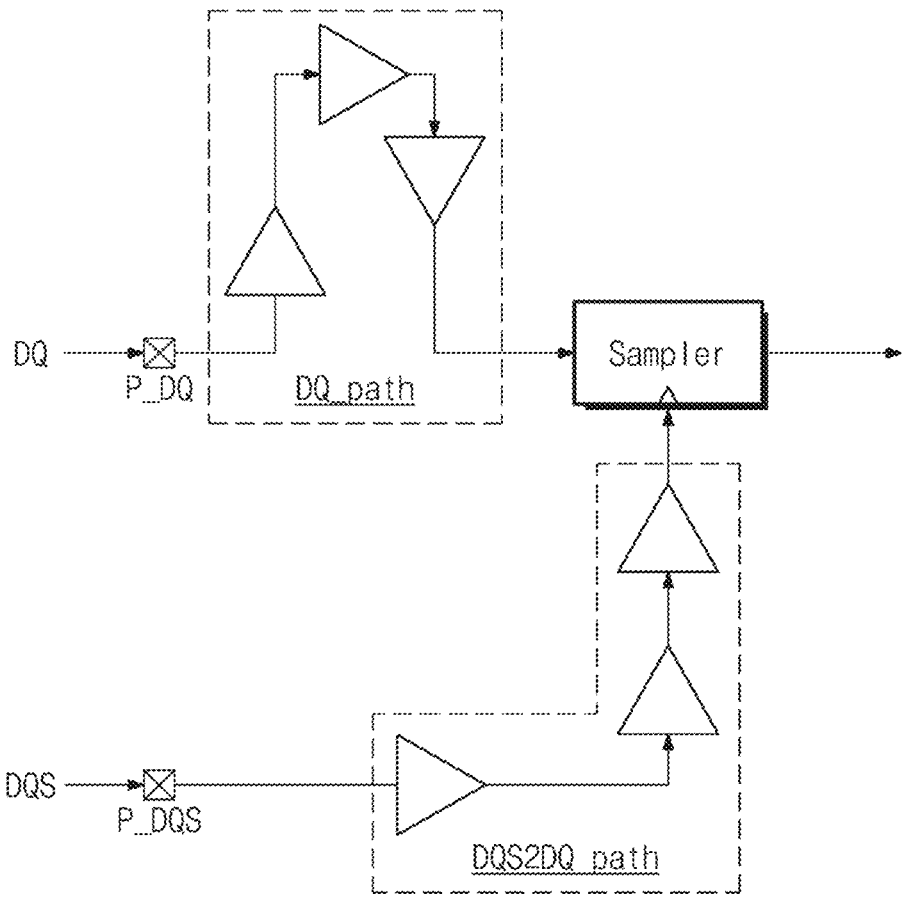
FIGS. 2A and 2B are diagrams provided to describe a DQS2DQ path and a DQS delay time in more detail.

Hereinafter, example embodiments will be described with reference to the accompanying drawings. The same reference numerals are used for the same components in the drawings, and redundant descriptions thereof will be omitted.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Functional elements such as those including "unit", " . . . er/or", "module", "logic", etc., described in the specification mean elements that process at least one function or operation, and may be implemented as processing circuitry such as hardware, software, or a combination of hardware and software, unless expressly indicated otherwise. For example, the processing circuitry more specifically may include, but is not limited to, electrical components such as at least one of transistors, resistors, capacitors, etc., or electronic circuits including said components, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

When the term "substantially", and/or the like, is used in this specification in connection with a numerical value, it is intended that the associated numerical value includes a manufacturing tolerance (e.g., ±10%) around the stated numerical value. Further, regardless of whether numerical values are modified as "substantially" and/or the like, it will be understood that these values should be construed as including a manufacturing or operational tolerance (e.g., ±10%) around the stated numerical values.

[Storage Device Performing Data Training at High Speed]

Figure 1:
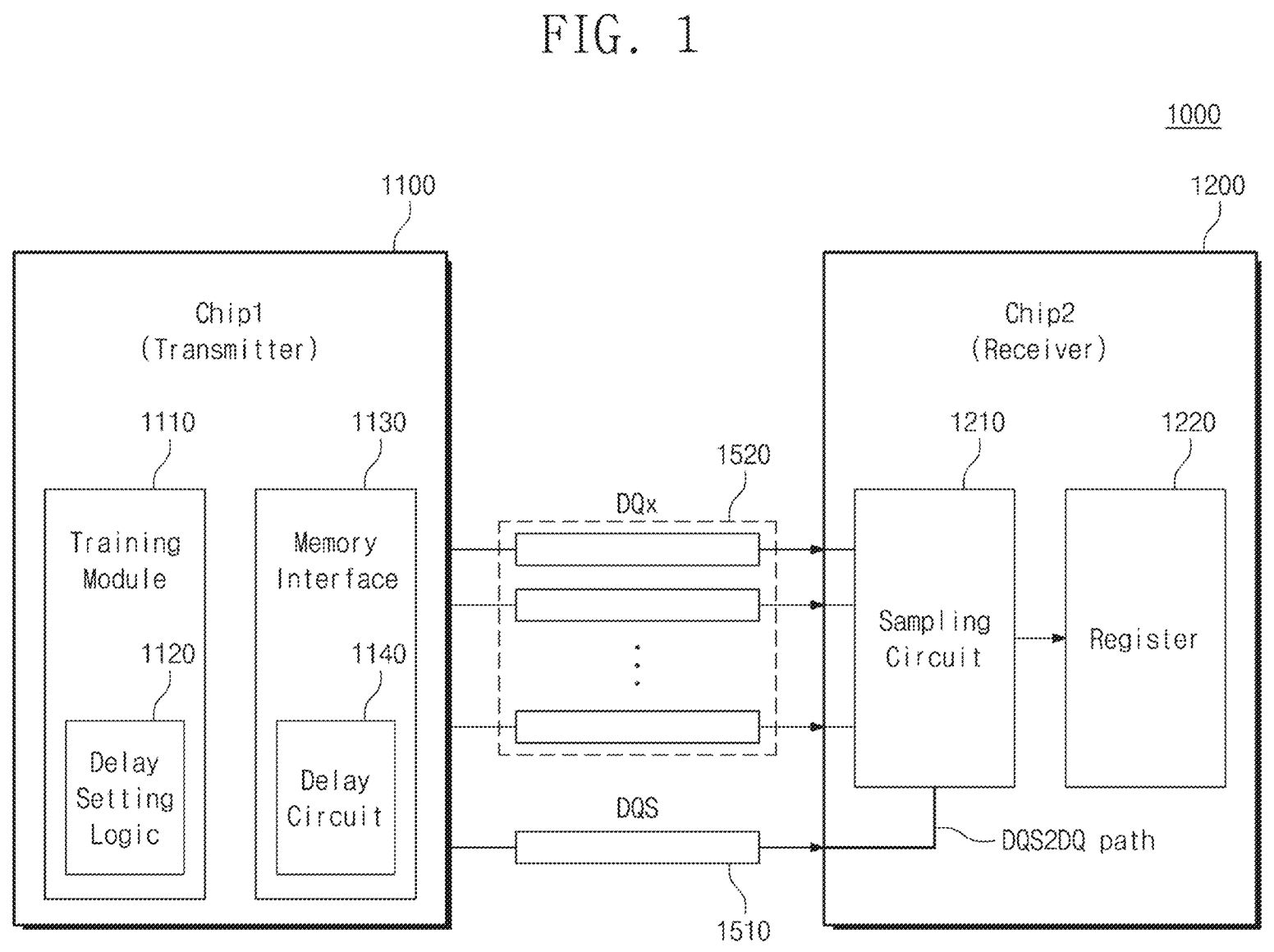

FIG. 1 is a schematic block diagram illustrating an example of a storage device 1000 according to some example embodiments.

In an environment in which a chip corresponding to a transmitter and a chip corresponding to a receiver exchange data using a data signal DQ and a data strobe signal DQS, DQ training according to the example embodiments may be applied. The chip corresponding to the transmitter may respectively apply different delay times to a plurality of data signal DQx, and the chip corresponding to the receiver may sample the plurality of data signals DQx having different delay times using the same data strobe signal DQS. In these cases, a sampling result value may vary depending on the DQS delay time. Accordingly, the data training according to some example embodiments may rapidly detect the DQS delay time, and overall time required for the data training may be reduced.

A more detailed description will be provided with reference to FIG. 1. Referring to FIG. 1, the storage device 1000 according to at least one example embodiment may include a first chip 1100 and a second chip 1200. A data strobe line 1510 and a data line 1520 for data exchange may be provided between the first chip 1100 and the second chip 1200.

The first chip 1100 may be configured to operate as a transmitter to transmit the data signal DQ and the data strobe signal DQS. The first chip 1100 may be, for example, a memory controller. However, this is merely an example, and the first chip 1100 may be implemented as various types of interface circuit transmitting the data signal DQ and the data strobe signal DQS. The first chip 1100 may include a training module 1110, a delay setting logic 1120, a memory interface 1130, and a delay circuit 1140.

The training module 1110 may be configured to perform data training on the second chip 1200 in a specific situation such as booting or initialization of the storage device 1000. The training module 1110 may improve the reliability of the data exchange with the second chip 1200. For example, the training module 1110 may be configured to write or read a training pattern in (or from) a memory of the second chip 1200 under various conditions to detect a center of an eye pattern of the data signal DQ. The training module 1110 may adjust, for example, an offset value of a delay locked loop (DLL) to align the detected center of the data signal DQ.

In at least one example embodiment, the training module 1110 may perform data training to rapidly detect a DQS delay time in the second chip 1200. The DQS delay time may correspond to time required by the DQS2DQ path in the second chip 1200. For example, the DQS delay time may be referred to as DQS2DQ time tDQS2DQ, WCK2DQ time tWCK2DQ, DQS flight time, flight time skew, and/or the like. For example, in at least one embodiment, the training module 1110 may include delay setting logic 1120 to rapidly sense the DQS delay time.

The delay setting logic 1120 may be configured to control the delay circuit 1140 such that the plurality of data signals DQx have different delay times, respectively. For example, the delay setting logic 1120 may control the delay circuit 1140 such that the plurality of data signals DQx have delay time sequentially increased by unit delay time tDLY. In these cases, a size of the unit delay time tDLY may be various set depending on an operation mode. However, this is merely an example, and the delay setting logic 1120 may set delay times to be applied to the plurality of data signals DQx in various manners.

The memory interface 1130 may be configured to provide interfacing between the first chip 1100 and the second chip 1200. For example, data processed by the first chip 1100 may be stored in the second chip 1200 through the memory interface 1130. Data stored in the second chip 1200 may be provided to the first chip 1100 through the memory interface 1130. During the data training, the plurality of data signals DQx may be delayed by different delay times, and may then be transmitted to the second chip 1200 through the memory interface 1130. The memory interface 1130 may include a delay circuit 1140 to delay the plurality of data signals DQx.

The delay circuit 1200 may be configured to respectively delay the plurality of data signals DQx by different delay times in response to the control of the delay setting logic 1120. For example, the delay circuit 1200 may sequentially delay the plurality of data signals DQx such that the plurality of data signals DQx have delay time sequentially increased by the unit delay time tDLY. In these cases, a time interval corresponding to the unit delay time tDLY may be present between two data signals DQ adjacent to each other. However, this is merely an example, and the delay times applied to the plurality of data signals DQx may be set in various manners.

Each of the plurality of data signals DQx, to which different delay times are applied by the delay circuit 1200, may be transmitted to the second chip 1200 through the data line 1520. The data strobe signal DQS may also be transmitted to the second chip 1200 through the data strobe line 1510.

The second chip 1200 may be configured to operate as a receiver to receive the data signals DQx and the data strobe signal DQS. The second chip 1200 may be, for example, a memory device including a nonvolatile memory and/or a volatile memory. However, this is merely an example, and the second chip 1200 may be implemented to include various types of storage device such as a memory, a register, a buffer, and/or the like.

In at least one example embodiment, the second chip 1200 may include a nonvolatile memory, and the nonvolatile memory may include nonvolatile memory cells such as memory cells of a flash memory, a resistive RAM (RRAM), a phase change RAM (PRAM), a magnetic RAM (MRAM), a ferroelectric random access memory (FRAM), a spin transfer torque random access memory (STT-RAM), and/or the like.

In at least one example embodiment, the second chip 1200 may include a volatile memory such as a dynamic random access memory (DRAM). In at least example embodiments, the second chip 1200 may include a storage device such as a buffer or register. Also, in at least one example embodiment, the second chip 1200 may include a heterogeneous memory and/or a storage device.

The second chip 1200 may include a sampling circuit 1210 and a register 1220.

The sampling circuit 1210 may be configured to receive the plurality of data signals DQx from the first chip 1100. Also, the sampling circuit 1210 may be configured to receive the data strobe signal DQS from the first chip 1100. The sampling circuit 1210 may sample the plurality of data signals DQx using the data strobe signal DQS, and may store the sampled data in a memory included in the second chip 1200.

Since the plurality of data signals DQx are sampled using the data strobe signal DQS, reliability of the data stored in the memory of the second chip 1200 may be determined by data training for aligning timings of the data strobe signal DQS and the data signals DQx. In addition, since a length of a DQS2DQ path is greater than a length of a DQ path, time required to detect the DQS delay time needs to be reduced so as to reduce time required for data training.

In at least one example embodiment, the sampling circuit 1210 may receive a plurality of data signals DQx, having different delay times, from the first chip 1100 during the data training. The sampling circuit 1210 may sample each of the data signals DQ having different delay times using the data strobe signal DQS, and may store a result of the sampling in the register 1220 as an initial code IC. In these cases, different delay times are respectively applied to the plurality of data signals DQx, so that a data value of the initial code IC (e.g., the result of the sampling) may vary depending on DQS delay time. For example, the initial code IC may include information on the DQS delay time.

In at least one example embodiment, the initial code IC stored in the register 1220 may be provided to the training module 1110 of the first chip 1100. The training module 1110 may be configured to detect the DQS delay time using an initial code IC. Also, the training module 1110 may adjust a setup margin of the data signals DQx to compensate for the DQS delay time. As described above, the information on the DQS delay time may be detected through a minimum sampling operation, so that time required to calculate the DQS delay time may be reduced.

As described above, the storage device 1000 according to at least one example embodiment may include a first chip 1100 corresponding to a transmitter and a second chip 1200 corresponding to a receiver, and the first chip 1100 may respectively apply different delay times to the plurality of data signals DQx and the second chip 1200 may sample the plurality of data signals DQx, having different delay times, using the same data strobe signal DQS. In these cases, a sampling result value may vary depending on the DQS delay time, and thus the DQS delay time may be rapidly detected. As a result, overall time required for data training may be reduced.

Figure 2B:
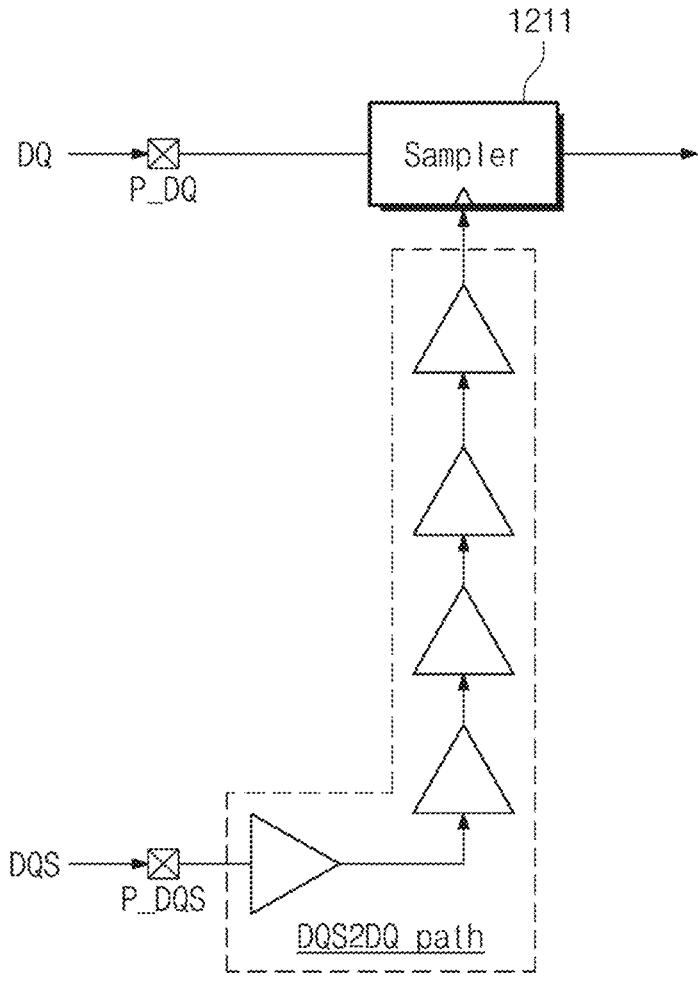

FIGS. 2A and 2B are diagrams provided to describe a DQS2DQ path and a DQS delay time in more detail. For example, FIG. 2A is a diagram illustrating an example of a receiver implemented such that the DQS2DQ path and the DQ path are the same or similar to each other, and FIG. 2B is a diagram illustrating an example of a receiver implemented such that a length of the DQS2DQ path is greater than a length of the DQ path.

For ease of description, it will be assumed that the DQ path is a path from a data signal pad P_DQ to a sampler and the DQS2DQ path is a path from the data strobe signal pad P_DQS to the sampler. However, this is merely an example and, according to example embodiments, the DQ path may be defined as various paths related to the data signal pad P_DQ and the sampler and the DQS2DQ path may be defined as various paths related to the data strobe signal pad P_DQS and the sampler.

Referring to FIG. 2A, the receiver may be implemented as a matched interface type in which a length of the DQ path and a length of the DQS2DQ path match each other.

In these cases, the length of the DQ path and the length of the DQS2DQ path are equal (or substantially similar) to each other, so that the DQ delay time and the DQS delay time may also be substantially equal to each other. The DQ delay time may correspond to time taken by the DQ path, and the DQS delay time may correspond to time taken by the DQS2DQ path. Accordingly, when a temperature or voltage level is changed, the DQ delay time and the DQS delay time may also be changed. Accordingly, the DQS delay time does not need to be additionally detected during data training. However, in the case of such a matched interface type, the number of branches required to implement DQ paths may be increased to cause an impedance issue, resulting in distortion of a data signal.

Referring to FIG. 2B, the receiver may be implemented as an unmatched interface type in which a length of the DQS2DQ path is greater than a length of the DQ path.

In these cases, the data signal pad P_DQ may be disposed adjacent to the sampler. Accordingly, the length of the DQ path may be small and the number of the branches required to implement the DQ path may also be small. Since there is a low probability that distortion will occur in the data signal, reliability of data may be improved.

However, in these cases, the DQ delay time and the DQS delay time do not match each other, so that the DQS delay time needs to be additionally detected. For example, the length of the DQ path may be small, and thus a DQ delay time may hardly occur, so that it is important to detect the DQS delay time. In addition, when a temperature or voltage level is changed, the DQS delay time may also be changed. Therefore, in these cases, it is necessary to detect the DQS delay time whenever the temperature or voltage level is changed.

Since the DQS delay time may be rapidly detected, the data training method according to at least one example embodiment may be effectively applied to an unmatched interface type receiver. For example, data training may be performed rapidly and stably through the data training method according to the example embodiments even under an environment in which a temperature or a voltage is frequently changed. However, this is merely an example and, according to example embodiments, the data training method according to at least one example embodiment may be effectively applied to a matched interface type receiver.

Figure 3:
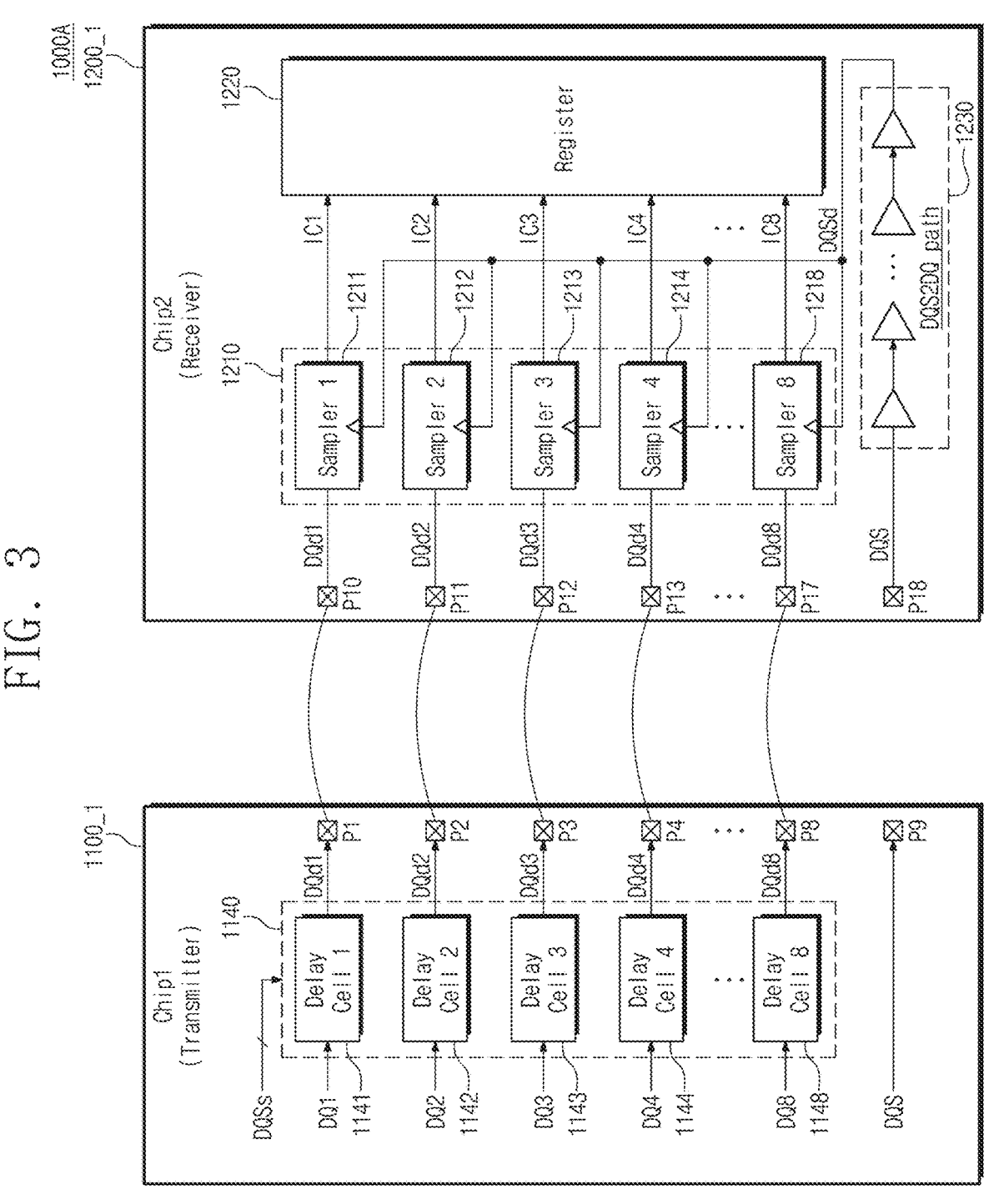
FIG. 3 is a diagram illustrating an example of the storage device of FIG. 1 implemented as unmatched interface type.
Figure 4A:
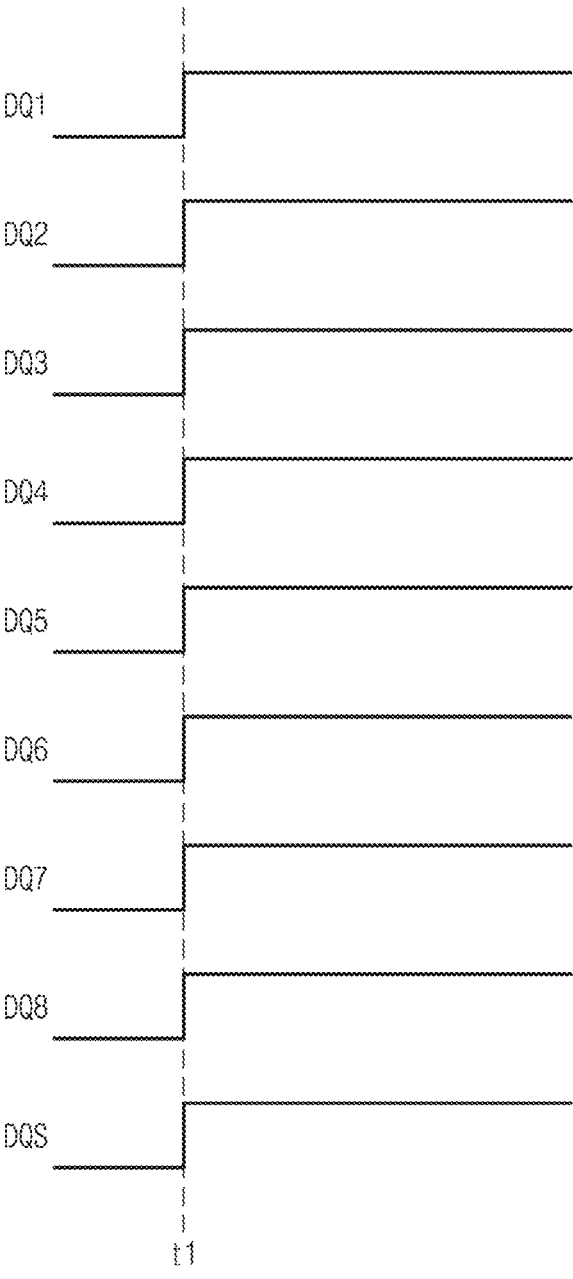
FIGS. 4A to 4C are diagrams provided to describe an operation of the storage device of FIG. 3.
Figure 4B:
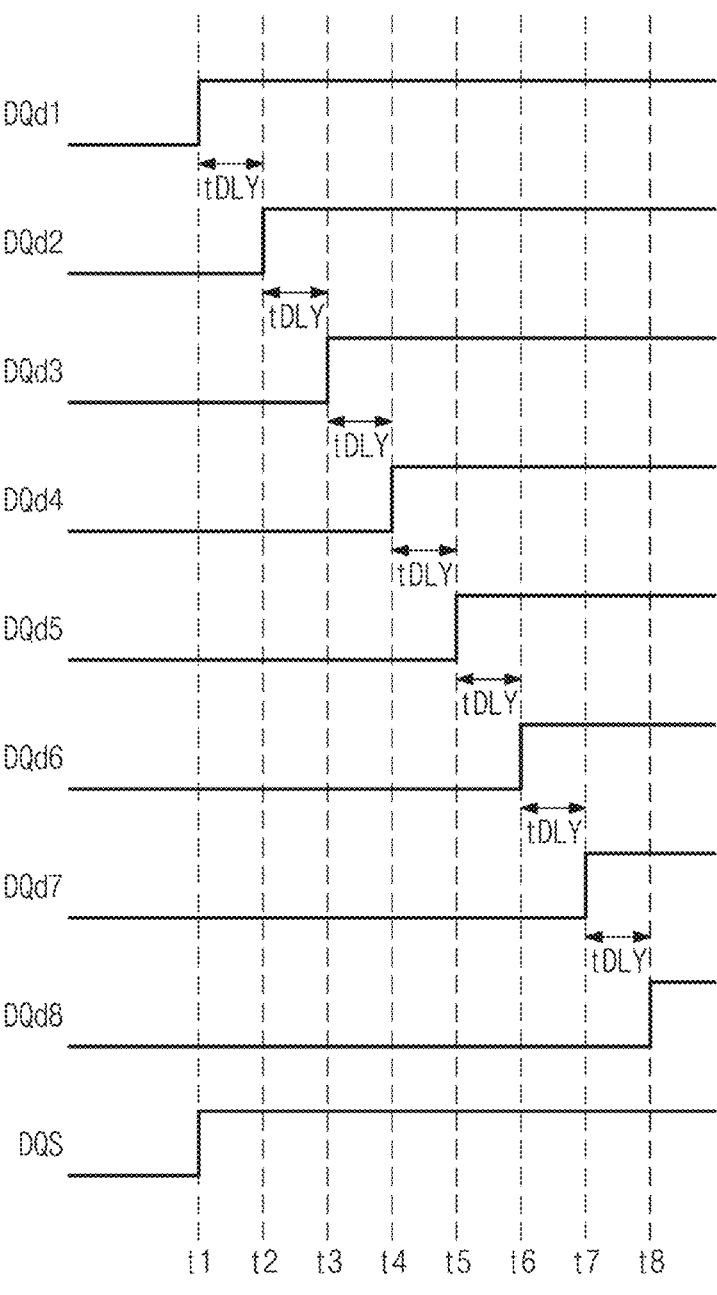
Figure 4C:
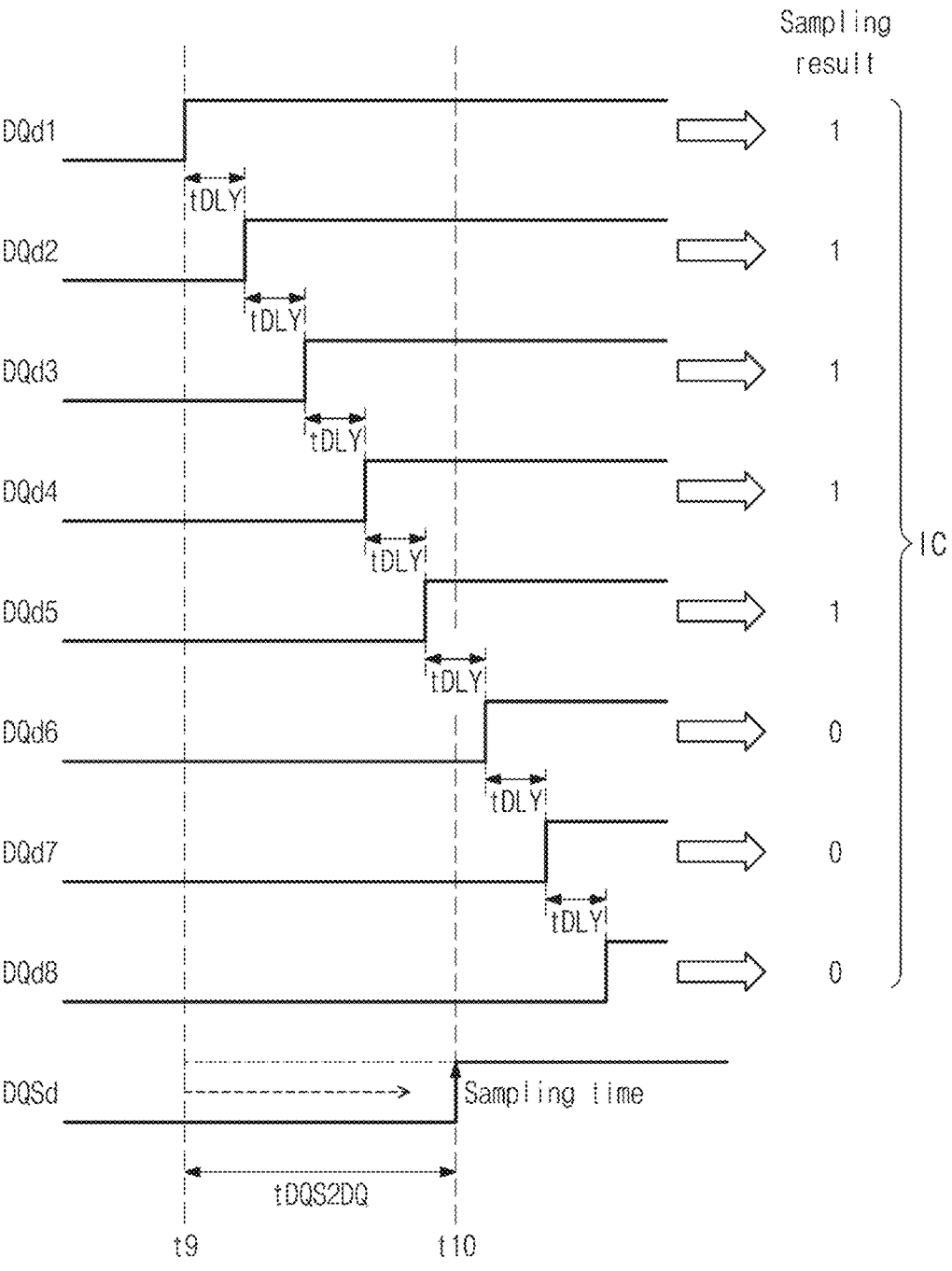

FIG. 3 is a diagram illustrating an example of the storage device of FIG. 1 implemented as unmatched interface type. FIGS. 4A to 4C are diagrams provided to describe an operation of the storage device 1000A of FIG. 3.

For example, FIG. 4A is a diagram illustrating an example of a data signal and a data strobe signal in an initial state, FIG. 4B is a diagram illustrating an example in which data signals are delayed by different delay times by a delay circuit 1140, and FIG. 4C is a diagram illustrating an example in which data signals, delayed by different delay times by a sampling circuit 1210, are sampled.

For ease of description, it will be assumed that a plurality of data signals (e.g., first to eighth data signals DQ1 to DQ8) are exchanged between a first chip 1100_1 and a second chip 1200_1. Also, it will be assumed that delay time of the plurality of data signals (e.g., first to eighth data signals DQ1 to DQ8) is sequentially increased by unit delay time tDLY during data training. However, this is merely an example, and the plurality of data signals may include, for example, more, or fewer, data signals than illustrated.

Referring to FIG. 3, the storage device 1000A may include a first chip 1100_1 operating as a transmitter and a second chip 1200_1 operating as a receiver.

The first chip 1100_1 may include a delay circuit 1140, and the delay circuit 1140 may include a plurality of delay cells 1141 to 1148. The plurality of delay cells 1141 to 1148 may receive the plurality of data signals DQ1 to DQ8, respectively.

For example, as illustrated in FIG. 4A, the first to eighth data signals DQ1 to DQ8 in an initial state may be in an aligned state with respect to a first point in time t1. For example, all of the first to eighth data signals DQ1 to DQ8 may transition from a low level to a high level with respect to the first point in time t1. Also, the data strobe signal DQS may also transition from a low level to a high level. The plurality of data signals DQ1 to DQ8 in an initial state may be provided to the plurality of delay cells 1141 to 1148, respectively.

Each of the plurality of delay cells 1141 to 1148 may receive a delay control signal DCS from a delay setting logic 1120. During data training, each of the plurality of delay cells 1141 to 1148 may apply different delay times to the plurality of data signals DQ1 to DQ8 in response to the corresponding delay control signal DCS.

For example, as illustrated in FIG. 4B, the plurality of delay cells 1141 to 1148 may delay the plurality of data signals DQ1 to DQ8 such that delay time of the data signals DQ1 to DQ8 is sequentially increased by unit delay time tDLY. In these cases, all time intervals between adjacent data signals may be the same as (or substantially similar to) the unit delay time tDLY.

For example, the first delay cell 1141 may pass the first data signal DQ1, and the second delay cell 1142 may delay the second data signal DQ2 by single unit delay time tDLY. Accordingly, a time interval equal to the unit delay time tDLY may be present between a first delayed data signal DQd1 and a second delayed data signal DQd2. Also, the third delay cell 1143 may delay the third data signal DQ3 by two unit delay times (for example, 2*tDLY). Accordingly, a time interval equal to the unit delay time tDLY may be present between the second delayed data signal DQd2 and a third delayed data signal DQd3. In such a manner, the fourth to eighth delay cells 1124 to 1128 may sequentially delay the fourth to eighth data signals DQ4 to DQ8.

Then, the first chip 1100_1 may transmit the plurality of delayed data signals DQd1 to DQd8 to the second chip 1200_1 through a plurality of pads (e.g., first to ninth pads P1 to P8) of the first chip 1100_1. In these cases, the first chip 1100_1 may transmit the data strobe signal DQS together.

Continuing to refer to FIG. 3, the second chip 1200_1 may include a sampling circuit 1210 and a register 1220, and the sampling circuit 1210 may include a plurality of samplers 1211 to 1218. The plurality of samplers 1211 to 1218 may receive the plurality of delayed data signals DQd1 to DQd8 through a plurality of pads (e.g., the first to eighth pads P10 to P17), respectively. In these cases, a time interval equal to the unit delay time tDLY may be present between two adjacent signals, among the plurality of delayed data signals DQd1 to DQd8.

For example, the first sampler 1211 may receive the first delayed data signal DQd1 through the first pad P10. In these cases, the first pad P10 may be disposed adjacent to the first sampler 1211. Accordingly, a DQ path corresponding to the first delayed data signal DQd1 may be formed to have a small length, and DQ delay time may hardly occur. The DQ path corresponding to the first delayed data signal DQd1 may be a path from the first pad P10 of the second chip 1200 to the first sampler 1211. Similarly, the second to eighth samplers 1212 to 1218 may receive the second to eighth delayed data signals DQd2 to DQd8 through the second to eighth pads P11 to P17, respectively. In these cases, the DQ delay time may hardly occur.

Accordingly, the plurality of delayed data signals DQd1 to DQd8 received by the plurality of samplers 1211 to 1218 may have a time interval, equal to the unit delay time tDLY, with respect to each other, as illustrated in FIG. 4C.

The first chip 1100_1 may transmit and the second chip 1200_1 may receive a data strobe signal DQS through the ninth pads P9 and P18. The data strobe signal DQS may be delayed by the DQS delay time through the DQS2DQ path, and a delayed data strobe signal DQSd may be provided to the first to eighth samplers 1211 to 1218. The DQS2DQ path may be a path from the ninth pad P18 of the second chip 1200_1 to each sampler. The length of the DQS2DQ path may be larger than the length of the DQ path, and thus relatively long DQS delay time may occur.

In at least one example embodiment, the plurality of samplers 1211 to 1218 may sample the plurality of delayed data signals DQd1 to DQd8 using the delayed data strobe signal DQSd, respectively.

For example, the DQS delay time may be denoted as DQS2DQ time tDQS2DQ, as illustrated in FIG. 4C. A rising edge of the data strobe signal DQS may be delayed by the DQS delay time. For ease of description, it will be assumed that the rising edge of the data strobe signal DQS is delayed from a ninth point in time t9 to a tenth point in time t10. Also, it will be assumed that the tenth point in time t10 is disposed between an edge of the fifth delayed data signal DQd5 and an edge of the sixth delayed data signal DQd6.

In these cases, the first to eighth samplers 1211 to 1218 may sample the plurality of delayed data signals DQd1 to DQd8 in synchronization with the rising edge of the delayed data strobe signal DQSd at the tenth point in time t10. For example, each of the first to fifth delayed data signals DQd1 to DQd5 has a high level at the tenth point in time t10, so that each of the first to fifth samplers 1212 to 1215 may output logic '1' as a sampling result. In addition, each of the sixth to eighth delayed data signals DQd6 to DQd8 has a low level at the tenth point in time t10, so that each of the sixth to eighth samplers 1216 to 1218 may output logic '0' as a sampling result. As a result, the sampling circuit 1210 may output a sampling result of '11111000' and may store the output sampling result in the register 1220 as the initial code IC.

The initial code IC may include information on the DQS delay time. For example, the initial code IC of '11111000' may include information indicating that DQS delay time is greater than four unit delay times (4*tDLY) and smaller than five unit delay times (5*tDLY), as illustrated in FIG. 4C.

The training module 1110 (see FIG. 1) may receive the initial code IC from the second chip 1200_1, and may detect the DQS delay time using the initial code IC. Also, the training module 1110 may adjust setup margins of the data signals DQx to compensate for the DQS delay time. However, this is merely an example and, according to some example embodiments, the training module 1110 may additionally perform various known training operations such as an operation of compensating for the DQS delay time and an operation of adjusting a data signal delay to align the data signals.

As described above, the storage device 1000A according to at least one example embodiment may sample a plurality of data signals, having different delay times, using the same data strobe signal to rapidly detect the DQS delay time. In addition, a receiver may be implemented as an unmatched interface type, and thus the storage device 1000A according to at least one example embodiment may further improve reliability of data.

Figure 5:
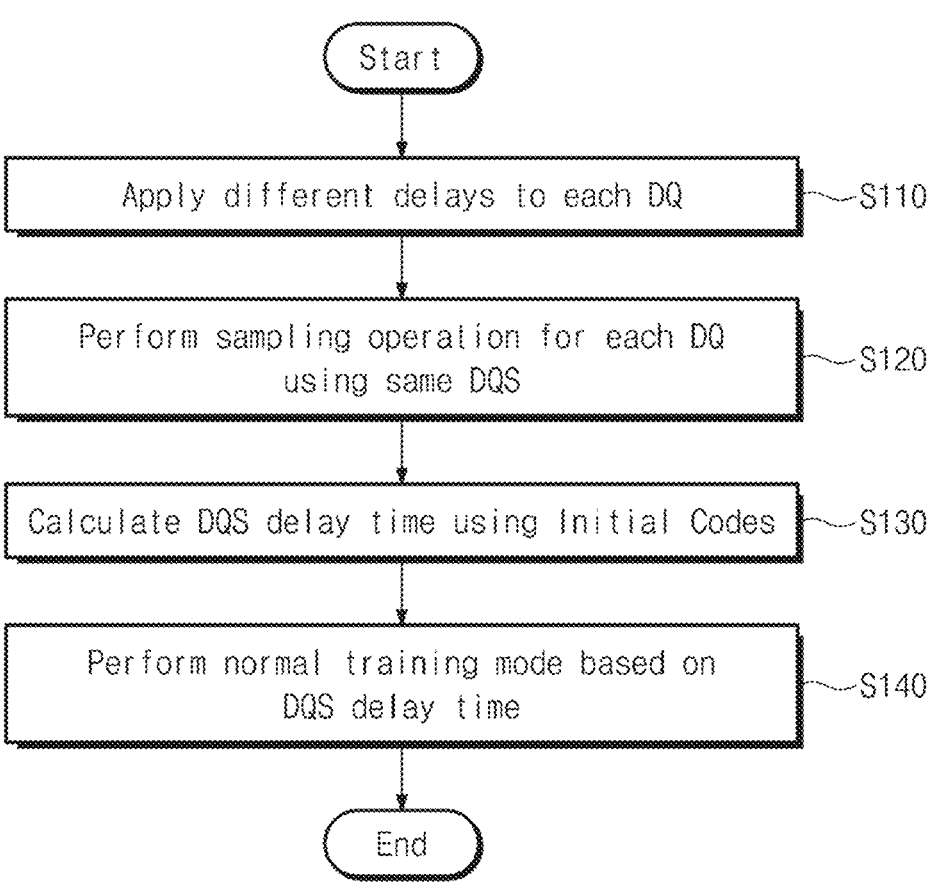
FIG. 5 is a flowchart provided to describe a data training operation of the storage device of FIG. 3.

FIG. 5 is a flowchart provided to describe a data training operation of the storage device 1000A of FIG. 3.

In operation S110, different delay times may be applied to the plurality of data signals DQx, respectively. For example, the delay circuit 1140 of the first chip 1100_1 may delay the plurality of data signals DQx such that delay time of the plurality of data signals DQx is sequentially increased by unit delay time tDLY. Then, the delayed data signals DQd may be transmitted to the second chip 1200_1 together with the data strobe signal DQS.

In operation S120, each of the delayed data signals DQd may be sampled using the same data strobe signal DQS. For example, the sampling circuit 1210 of the second chip 1200_1 may receive the delayed data signals DQd and the data strobe signal DQS. The data strobe signal DQS may be delayed by the DQS delay time through the DQS2DQ path. The sampling circuit 1210 may sample each of the delayed data signals DQd using the data strobe signal DQSd delayed by the DQS2DQ delay time. The sampling result may be stored in the register 1220 as an initial code IC. A data value of the initial code IC may vary depending on a length of the DQS delay time.

In operation S130, the DQS2DQ delay time may be determined using the initial code IC. For example, the training module 1110 may receive an initial code IC stored in the register 1220 and may determine the DQS delay time based on the received initial code IC.

In operation S140, a general data training operation may be performed based on the DQS delay time. For example, write and read operations corresponding to a plurality of operations may be repeated to find a location and a setup margin of the data signal DQ matching the data strobe signal DQS at an optimal timing. Also, for example, the delay time of the data signal DQ may be set based on the setup margin of the determined data signal DQ.

As described above, the data training operation according to at least one example embodiment may sample the plurality of data signals DQx, having different delay time, using the same data strobe signal DQS. Accordingly, the DQS delay time may be rapidly detected, and overall time required for data training may be reduced.

[Storage Devices Supporting Coarse Mode and Fine Mode]

Figure 6:
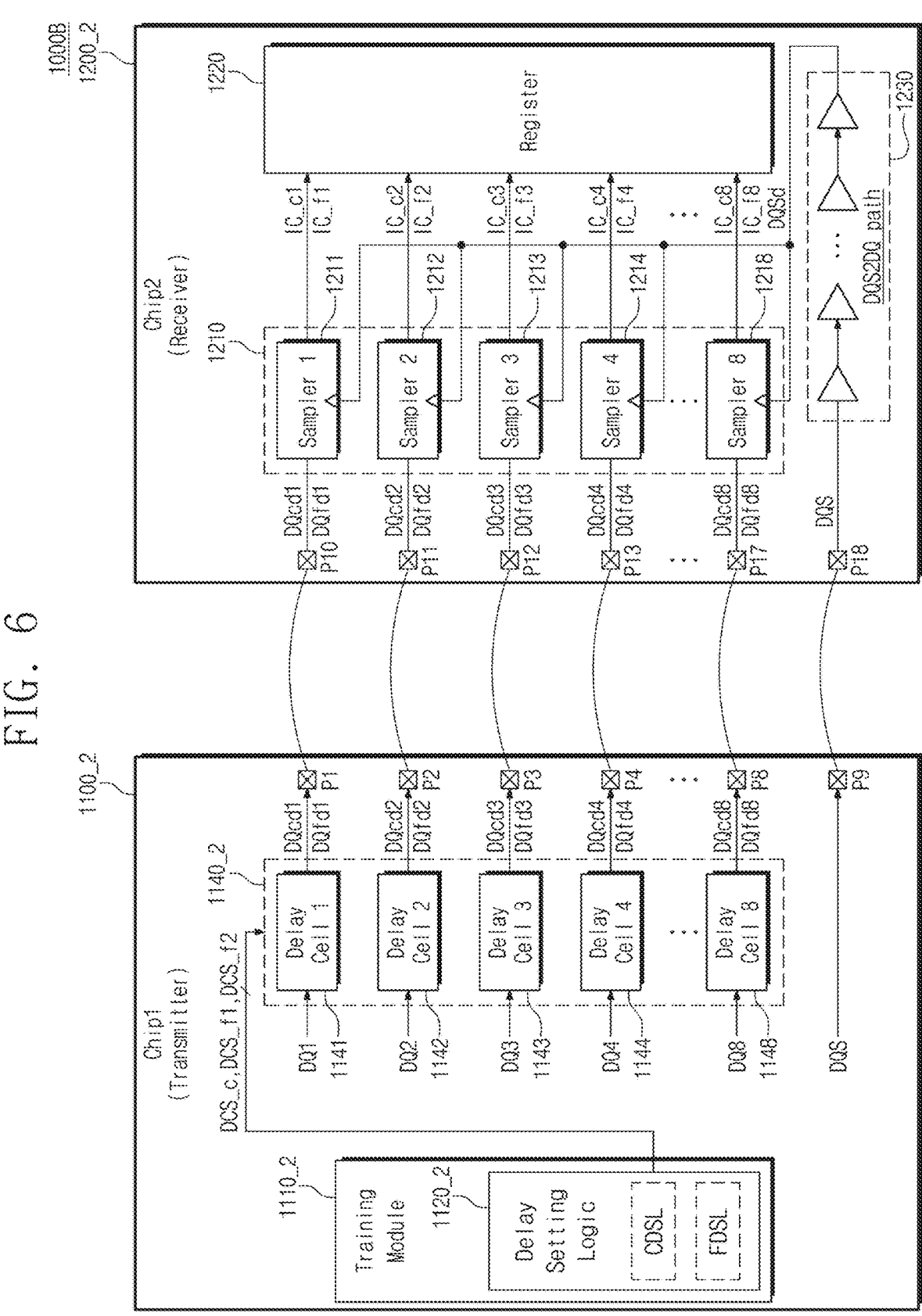
FIG. 6 is a diagram illustrating another example of the storage device of FIG. 1.
Figure 7A:
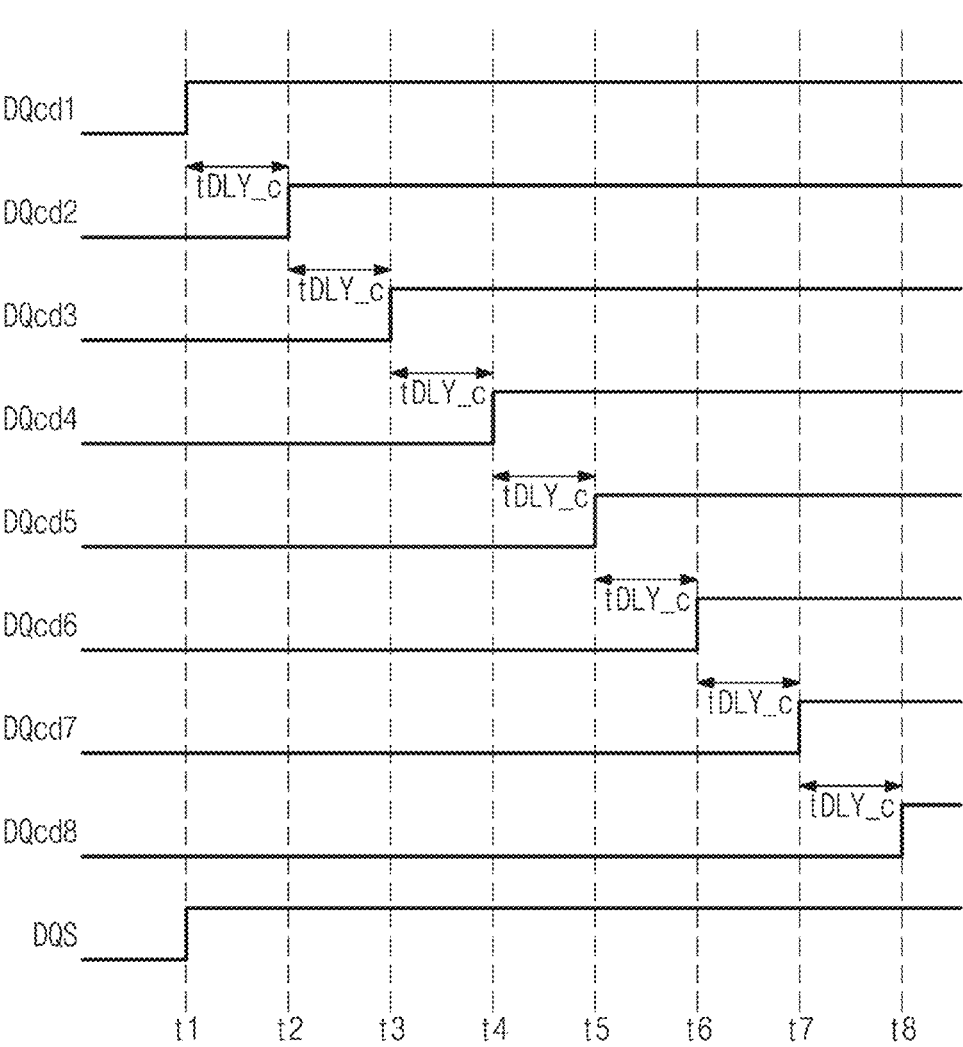
FIGS. 7A and 7B are diagrams illustrating an example in which the storage device of FIG. 6 operates in a coarse mode.
Figure 7B:
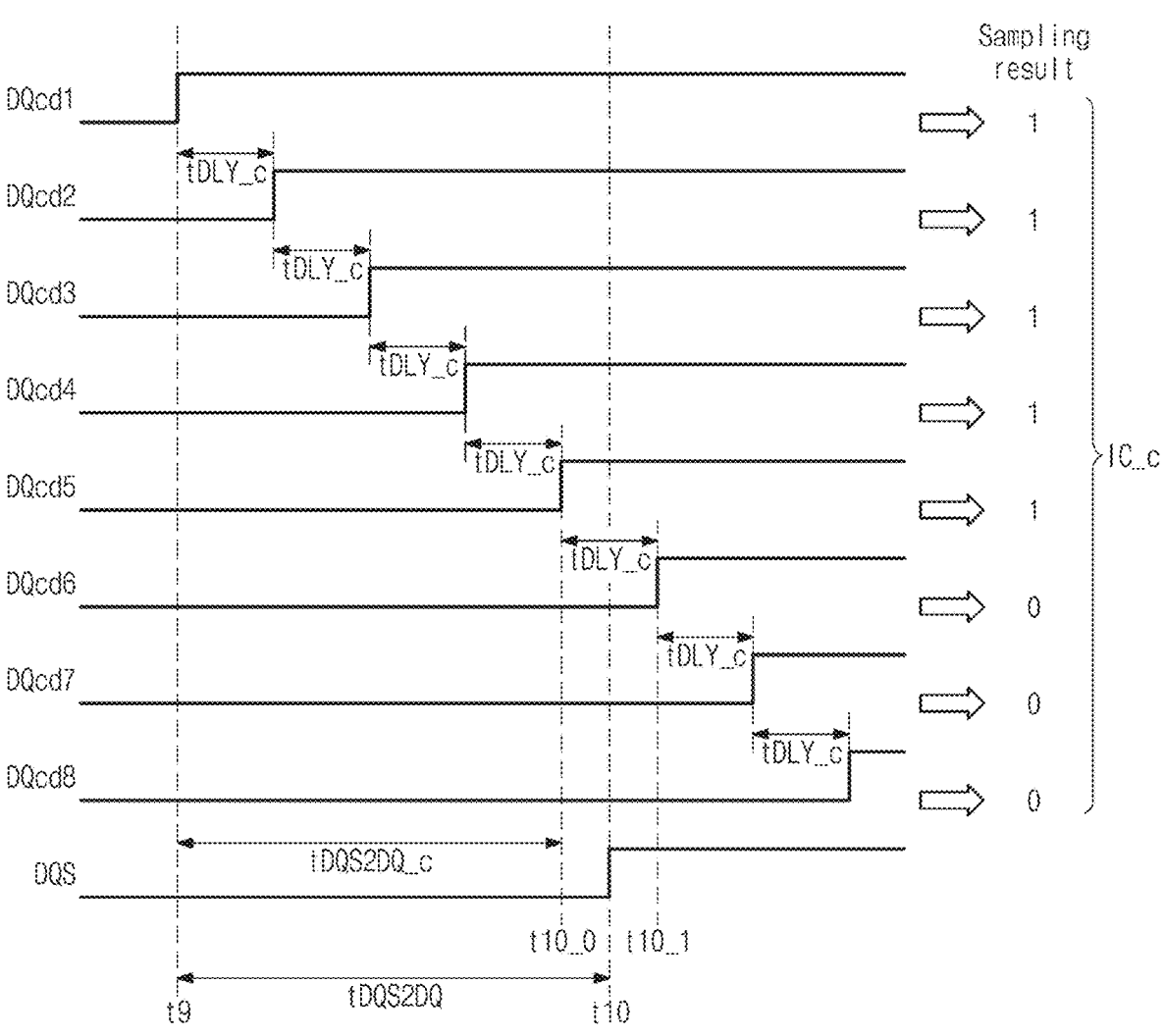
Figure 8A:
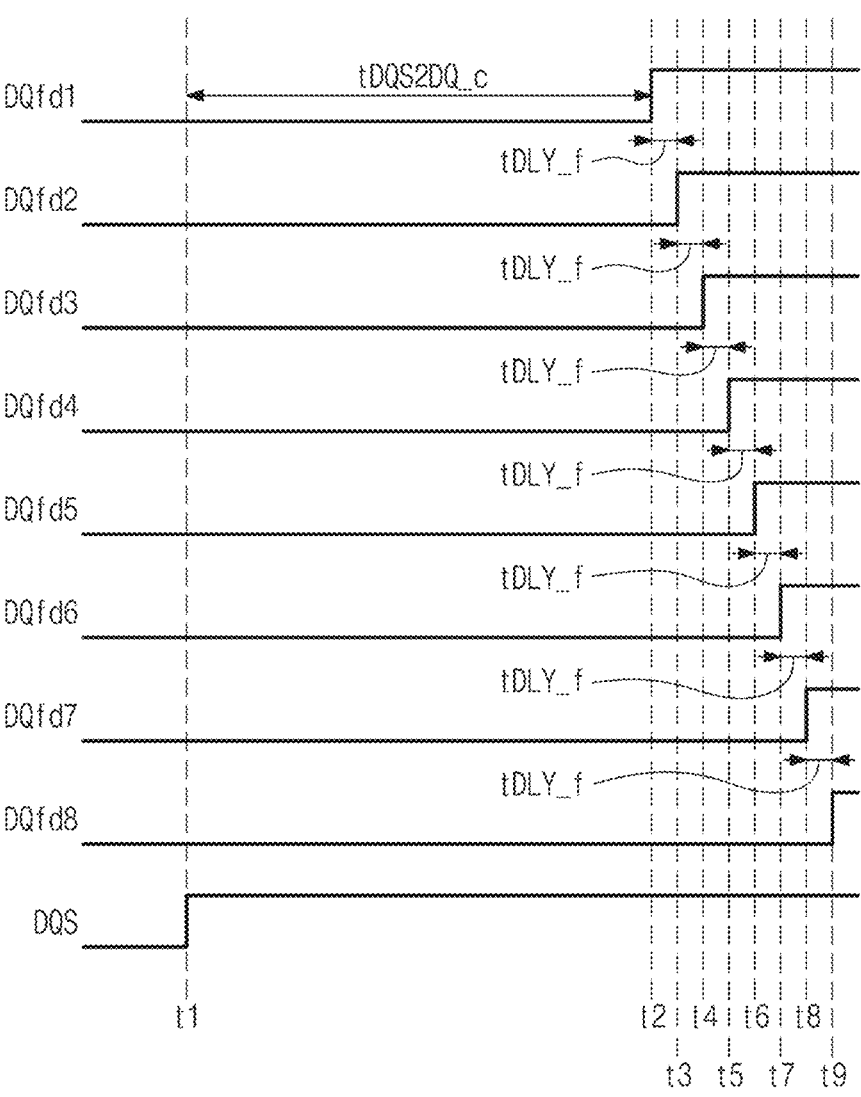
FIGS. 8A and 8B are diagrams illustrating an example in which the storage device of FIG. 6 operates in a fine mode.
Figure 8B:
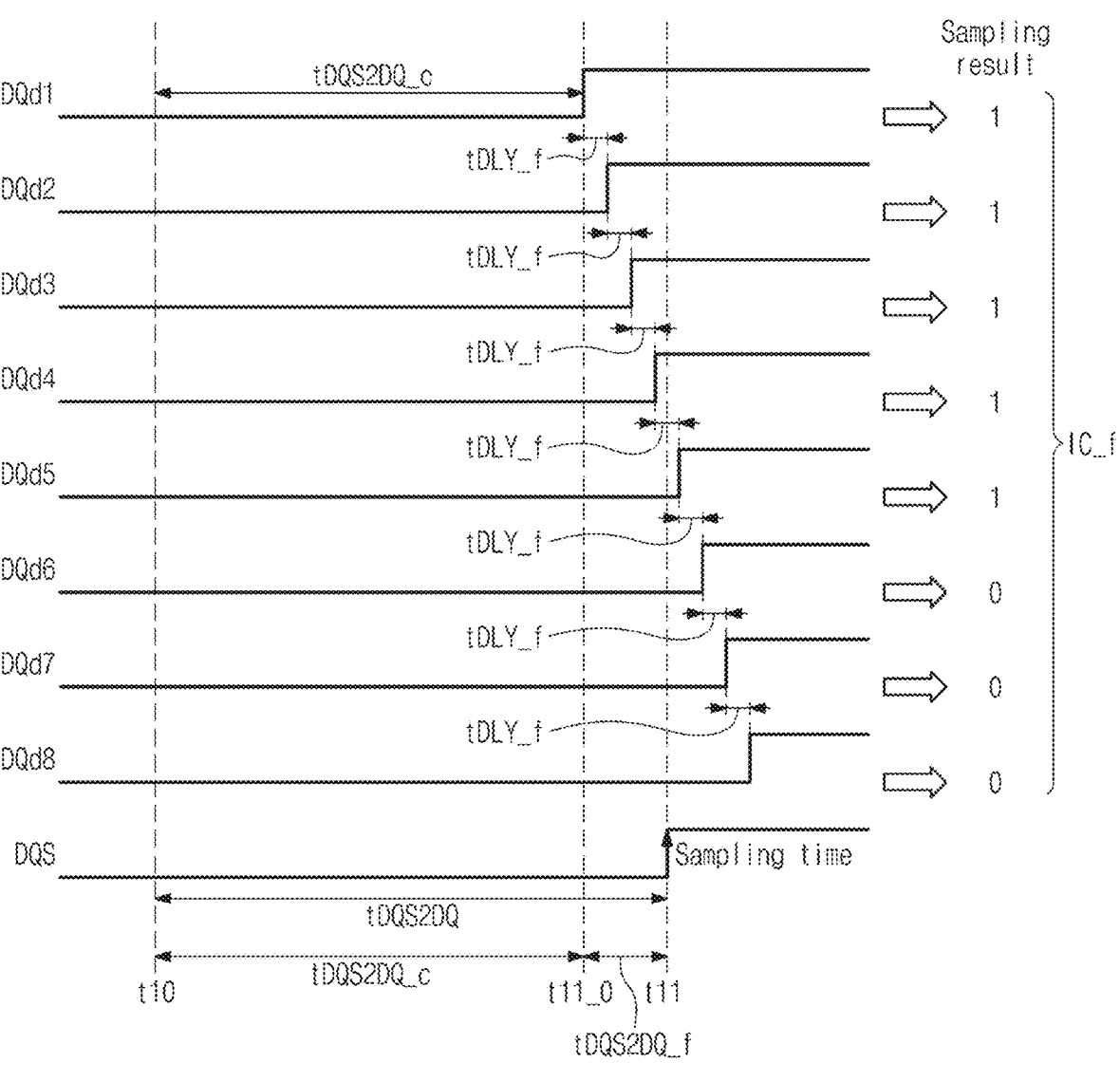

FIG. 6 is a diagram illustrating another example of the storage device of FIG. 1. FIGS. 7 and 8 are diagrams describe to describe an operation of the storage device 1000B of FIG. 6. For example, FIGS. 7A and 7B are diagrams illustrating an example in which the storage device 1000B of FIG. 6 operates in a coarse mode. FIGS. 8A and 8B are diagrams illustrating an example in which the storage device 1000B of FIG. 6 operates in a fine mode. A configuration and an operation of the storage device 1000B of FIG. 6 is similar to those of the storage device 1000A of FIG. 3. Therefore, the same or similar components are denoted by the same or similar reference numerals, and redundant descriptions will be omitted below. For ease of description, it will be assumed that the first to eighth data signals DQ1 to DQ8 are exchanged between the first chip 1100 and the second chip 1200, similarly to FIG. 3.

The storage device 1000B of FIG. 6 may operate in a code mode and a fine mode.

The storage device 1000B may delay data signals DQx using first unit delay time tDLY_c during data training in the coarse mode. The first unit delay time tDLY_c may have a relatively large amount of delay time. Accordingly, in the coarse mode, a range to which the DQS delay time belongs may be rapidly detected in the coarse mode. The storage device 1000B may delay data signals DQx using second unit delay time tDLY_f during data training in the fine mode. The second unit delay time tDLY_f may have a relatively small amount of delay time. Accordingly, the DQS delay time may be accurately detected in the fine mode.

The storage device 1000B of FIG. 6 may sequentially perform the data training in the coarse and the data training in the fine mode. Accordingly, the storage device 1000B of FIG. 6 may rapidly and accurately detect the DQS delay time even under an environment in which a significantly large amount of DQS delay time occurs due to a significantly long DQS2DQ path.

This will be described in more detail with reference FIG. 6. The storage device 1000B may include a first chip 1100_2 operating as a transmitter and a second chip 1200_2 operating as a receiver.

The training module 1110_2 may perform data training in a coarse mode and data training in a fine mode. For example, the training module 1110_2 may perform the data training in the coarse mode, and may then perform the data training in the fine mode. To this end, the training module 1110_2 includes a delay setting logic 1120_2, and the delay setting logic 1120_2 may include a coarse delay setting logic CDSL and a fine delay setting logic FDSL.

Hereinafter, the data training in the coarse mode according to at least one example embodiment will be described.

In the coarse mode, the coarse delay setting logic CDSL may control the delay circuit 1140_2. For example, the coarse delay setting logic CDSL may transmit a coarse delay control signal DCS_c to a delay circuit 1140_2 such that a plurality of data signals DQx have delay time sequentially increased by first unit delay time tDLY_c.

The delay circuit 1140_2 may receive the coarse delay control signal DCS_c from the coarse delay setting logic CDSL. The delay circuit 1140_2 may control the plurality of data signals DQ1 to DQ8 in response to the coarse delay control signal DCS_c such that the plurality of data signals DQ1 to DQ8 have delay time sequentially increased by the first unit delay time tDLY_c.

For example, in the coarse mode, the plurality of delay cells 1141 to 1148 may delay the plurality of data signals DQ1 to DQ8 such that adjacent data signals have a time interval corresponding to the first unit delay time tDLY_c, as illustrated in FIG. 7A. Then, the plurality of delayed data signals DQcd1 to DQcd8 may be transmitted to the second chip 1200 together with the data strobe signal DQS.

The plurality of samplers 1211 to 1218 may receive the plurality of delayed data signals DQcd1 to DQcd8, respectively. Each of the plurality of samplers 1211 to 1218 may receive a delayed data strobe signal DQSd. For example, the DQS delay time may be denoted as DQS2DQ time tDQS2DQ, as illustrated in FIG. 7B.

The plurality of samplers 1211 to 1218 may sample the plurality of delayed data signals DQd1 to DQd8 using the delayed data strobe signal DQSd. For example, the sampling circuit 1210 may output a sampling result of '11111000' and may store the output sampling result in the register 1220 as a coarse initial code IC_c, as illustrated in FIG. 7B.

The training module 1110_2 may receive the coarse initial code IC_c from the second chip 1200_2 and may primarily detect a coarse DQS delay time using the coarse initial code IC_c. For example, the DQS delay time detected in the coarse mode may belong to a range between a (10_0)-th point in time t10_0 and a (10_1)-th point in time t10_1. In these cases, the training module 1110_2 may detect smallest time within the ranges, to which the DQS delay time belongs, as the coarse DQS delay time. In FIG. 7B, the coarse DQS delay time is denoted as tDQS2DQ_c. However, this is merely an example, and the training module 1110_2 may detect a time within the range, to which the DQS delay time belongs, as the coarse DQS delay time.

Hereinafter, the data training in fine mode according to at least one example embodiment will be described.

In the fine mode, a fine delay setting logic FDSL may transmit a fine delay control signal DCS_f to the delay circuit 1140_2, and the delay circuit 1140_2 may delay the plurality of data signals DQ1 to DQ8 in response to responds to the fine control signal DCS_f.

In at least one example embodiment, the fine delay setting logic FDSL may transmit a first fine delay control signal DCS_f1 to the delay circuit 1140_2 such that all of the plurality of data signals DQ1 to DQ8 are delayed by the coarse DQS delay time tDQS2DQ_c. In these cases, the delay circuit 1140_2 may delay the plurality of data signals DQ1 to DQ8 by a coarse DQS delay time tDQS2DQ_c in response to the first fine delay control signal DCS_f1, as illustrated in FIG. 8A.

The coarse delay setting logic CDSL may additionally transmit a second fine delay control signal DCS_f2 to the delay circuit 1140_2 such that the plurality of data signals DQx have delay time sequentially increased by a second unit delay time tDLY_f. In these cases, the delay circuit 1140_2 may additionally delay the plurality of signals DQ1 to DQ8 in response to the second fine delay control signal DCS_f2 such that the plurality of data signals DQ1 to DQ8 have delay time sequentially increased by the second unit delay time tDLY_f.

In these cases, a size of the second unit delay time tDLY_f may be smaller than a size of the unit delay time tDLY_c. For example, the size of the second unit delay time tDLY_f may be smaller than or equal to a value obtained by dividing the first unit delay time tDLY_c by the number of data signals. However, this is merely an example, and the sizes of the first and second unit delay times tDLY_c and tDLY_f may be variously defined according to example embodiments.

Then, the plurality of delayed data signals DQfd1 to DQfd8 may be transmitted to the second chip 1200_2 together with the data strobe signal DQS.

The first to eighth samplers 1211 to 1218 may receive the first to eighth delayed data signals DQfd1 to DQfd8, respectively. In these cases, a time interval equal to the second unit delay time tDLY_f may be present between two adjacent signals, among the first to eighth delayed data signals DQfd1 to DQfd8, as illustrated in FIG. 8B.

Each of the first to eighth samplers 1211 to 1218 may receive a delayed data strobe signal DQSd. The first to eighth samplers 1211 to 1218 may sample the first to eighth delayed data signals DQfd1 to DQfd8 using the delayed data strobe signal DQSd. For example, the sampling circuit 1210 may output a sampling result of '11110000' and store the output sampling result in the register 1220 as a fine initial code IC_f, as illustrated in FIG. 8B.

The training module 1110_2 may receive the fine initial code IC_f from the second chip 1200_2 and may secondarily detect the fine DQS delay time using the received fine initial code IC_f. The fine DQS delay time may be denoted as tDQS2DQ_f in FIG. 8B. Then, the training module 1110_2 may add the coarse DQS delay time tDQS2DQ_c, detected in the coarse mode, and the fine DQS delay time tDQS2DQ_f, detected in the fine mode, to detect total DQS delay time tDQS2DQ.

As described above, the storage device 1000B according to at least one example embodiment may perform the data training in the coarse mode, and may then perform the data training in the fine mode to detect the DQS delay time rapidly and accurately.

Figure 9:
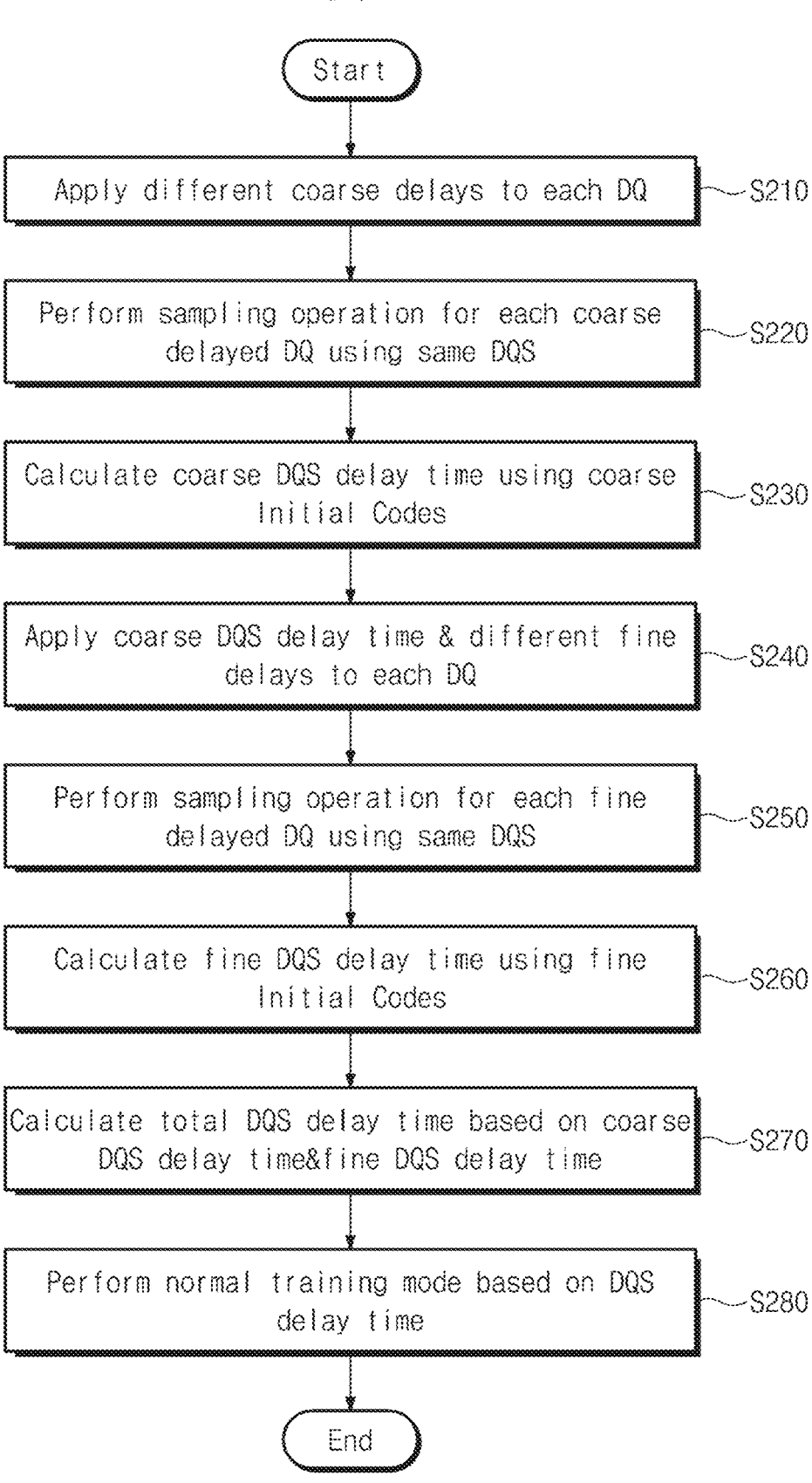
FIG. 9 is a flowchart provided to describe a data training operation of the storage device of FIG. 6.

FIG. 9 is a flowchart provided to describe a data training operation of the storage device 1000B of FIG. 6.

In operation S210, a coarse delay time may be applied to each of the plurality of data signals DQx. For example, the delay circuit 1140_2 of the first chip 1100_2 may delay each of the plurality of data signals DQx such that delay time of the plurality of data signals DQx is sequentially increased by first unit delay time tDLY_c. Then, delayed data signals DQcd may be transmitted to the second chip 1200_2 together with the data strobe signal DQS.

In operation S220, each of the delayed data signals DQcd may be sampled using the same data strobe signal DQS. For example, the sampling circuit 1210 of the second chip 1200_2 may receive the delayed data signals DQcd and the data strobe signal DQS. The sampling circuit 1210 may sample each of the delayed data signals DQcd using the delayed data strobe signal DQSd. A sampling result may be stored in the register 1220 as a coarse initial code IC_c.

In operation S230, coarse DQS delay time tDQS2DQ_c may be determined using the coarse initial code IC_c. For example, the training module 1110_2 may receive the coarse initial code IC_c stored in the register 1220, and may determine a range of the coarse DQS delay time based on the received coarse initial code IC_c. A value within a range, to which the coarse DQS delay time belongs, may be set as the coarse DQS delay time.

In operation S240, the same coarse DQS delay time tDQS2DQ_c may be applied to each of the plurality of data signals DQx. For example, all of the plurality of data signals DQx may be delayed by the coarse DQS delay time. The plurality of data signals DQx may be delayed based on the fine delay time. For example, the delay circuit 1140_2 of the first chip 1100_2 may delay each of the plurality of data signals DQx such that the delay time is sequentially increased by second unit delay time tDLY_f. In these cases, the second unit delay time tDLY_f may be smaller than the first unit delay time tDLY_c. Then, delayed data signals DQfd may be transmitted to the second chip 1200_2 together with the data strobe signal DQS.

In operation S250, each of the delayed data signals DQfd may be sampled using the same data strobe signal DQS. For example, the sampling circuit 1210 of the second chip 1200_2 may receive the delayed data signals DQfd and the data strobe signal DQS. The sampling circuit 1210 may sample each of the delayed data signals DQfd using the delayed data strobe signal DQSd. A sampling result may be stored in the register 1220 as a fine initial code IC_f.

In operation S260, fine DQS delay time may be determined using the fine initial code IC_f. For example, the training module 1110_2 may receive the fine initial code IC_f stored in the register 1220, and may detect the fine DQS delay time based on the received fine initial code IC_f.

In operation S270, the training module 1110_2 may add the coarse DQS delay time, detected in the coarse mode, and the fine DQS delay time, detected in the fine mode, to determine total DQS delay time.

In operation S270, a general data training operation may be performed based on the detected DQS delay time. For example, write and read operations corresponding to a plurality of operations may be repeated to find a location and a setup margin of the data signal DQ of the data strobe signal DQS and the data signal matching an optimal timing. In addition, for example, the delay time of the data signal DQ may be set based on the setup margin of the determined data signal DQ.

As described above, in the data training operation according to at least one example embodiment, the data training may be performed in the coarse mode, and the data training may be then performed in the fine mode to detect the DQS delay time rapidly and accurately.

[Controller and Nonvolatile Memory Device Performing Data Training at High Speed]

Figure 10:
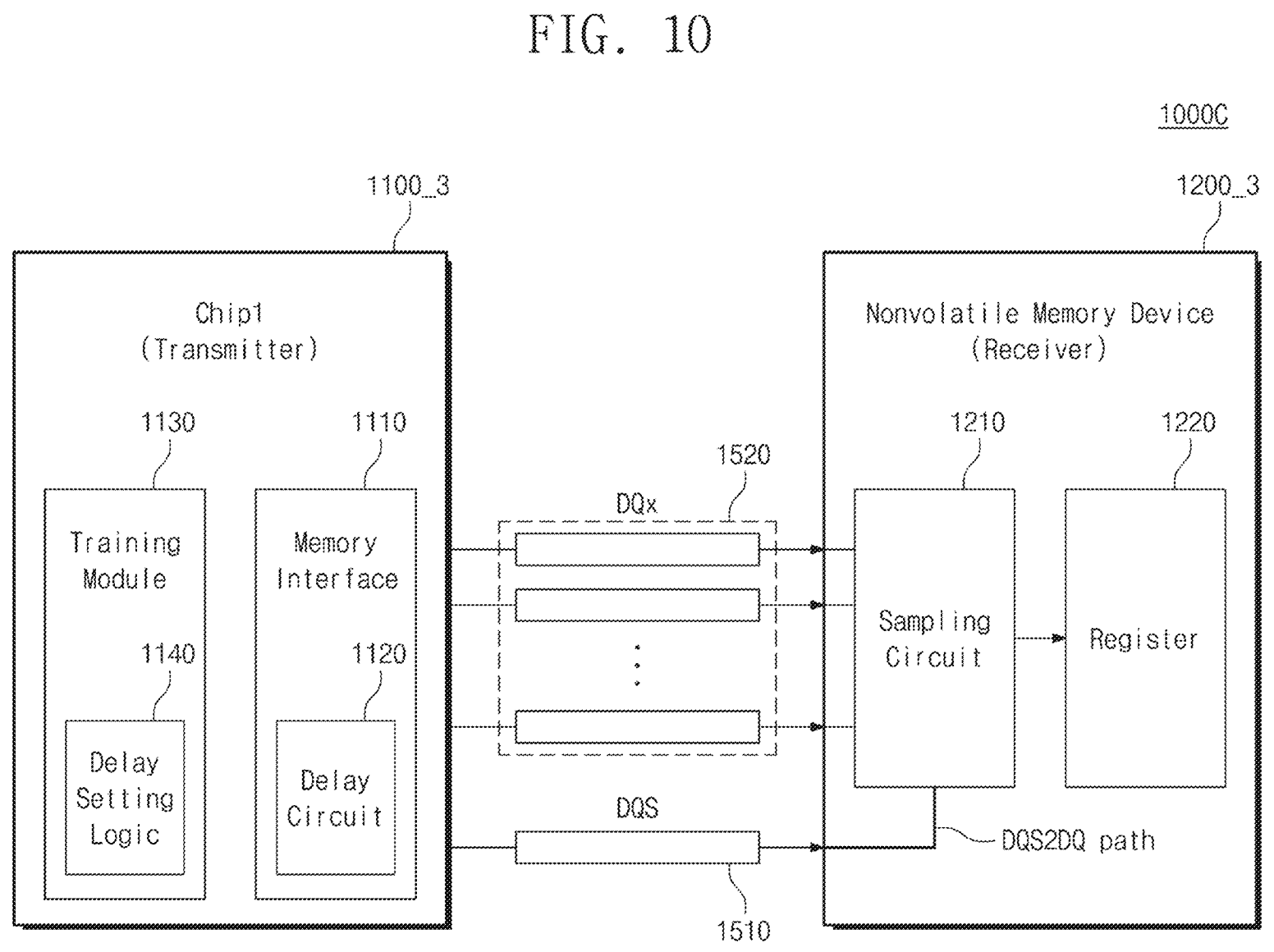

FIG. 10 is a diagram illustrating an example of the storage device of FIG. 1. For example, FIG. 10 illustrates an example in which the second chip of FIG. 1 is implemented as a nonvolatile memory device and the first chip is implemented as a controller. The storage device 1000C of FIG. 10 is similar to the storage devices 1000, 1000A, and 1000B of FIGS. 1, 3, and 6. Therefore, the same or similar components are denoted by the same or similar reference numerals, and redundant descriptions will be omitted below.

Referring to FIG. 10, a storage device 1000C may include a controller 1100_3 and a nonvolatile memory device 1200_3.

The nonvolatile memory device 1200_3 may include various memories such as a flash memory, a phase change memory (PRAM), a magnetoresistive memory (MRAM), a resistive memory (RRAM), a ferroelectric memory (FRAM), and/or the like.

The nonvolatile memory device 1200_3 may include homogeneous memories and/or heterogeneous memories. The nonvolatile memory device 1200_3 may communicate with the controller 1100_3 through a data strobe line 1510 and a data line 1520.

The controller 1100_3 may be configured to control the nonvolatile memory device 1200_3. For example, the controller 1100_3 may control the nonvolatile memory device 1200_3 to perform a write, read, or erase operation. Also, the controller 1100_3 may perform data training on the nonvolatile memory device 1200_3.

In at least one example embodiment, the controller 1100_3 may respectively apply different delay times to a plurality of data signals DQx, and the nonvolatile memory device 1200_3 may sample the plurality of data signals DQx having different delay times using the same data strobe signal DQS. Accordingly, the DQS delay time may be rapidly detected, and overall time required for data training may be reduced.

Figure 11:
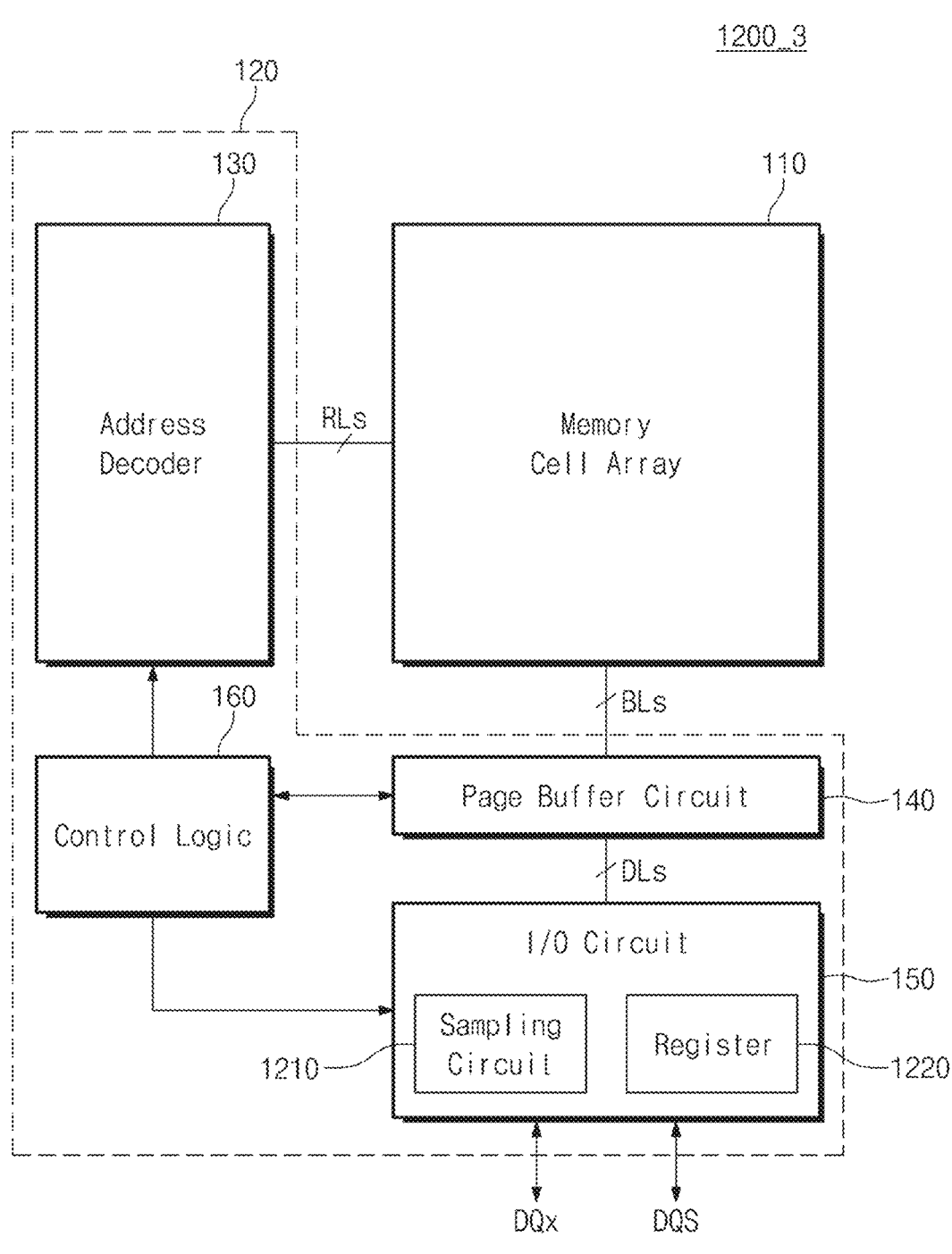
FIG. 11 is a block diagram illustrating a nonvolatile memory device of FIG. 10 in more detail.

FIG. 11 is a block diagram illustrating the nonvolatile memory device 1200_3 of FIG. 10 in more detail.

Referring to FIG. 11, the nonvolatile memory device 1200_3 may include a memory cell array 110 and a peripheral circuit 120, and the peripheral circuit 120 may include an address decoder 130, a page buffer circuit 140, an input/output circuit 150, and a control logic 160.

The memory cell array 110 may include a plurality of memory blocks. Each of the memory blocks may have a two-dimensional (2D) structure or a three-dimensional (3D) structure. For example, in a memory block having a 2D structure (or a horizontal structure), memory cells may be formed in a direction, parallel to a substrate; and in a memory block having a 3D structure (or a vertical structure), memory cells may be formed in a direction, perpendicular to the substrate.

The address decoder 130 may be connected to the memory cell array 110 through row lines RLs. The row lines RLs may include string select lines, ground select lines, word lines, and/or dummy word lines.

The page buffer circuit 140 may be connected to the memory cell array 110 through bit lines BLs. The page buffer circuit 140 may be configured to temporarily store data to be programmed in the selected page, or data read from a selected page.

The input/output circuit 150 may be internally connected to the page buffer circuit 140 through data lines DLs, and may be externally connected to the controller 1100_3 through a data strobe line 1510 and a data line 1520.

The control logic 160 may be configured to control the overall operation of the nonvolatile memory device 1200_3.

In at least one example embodiment, the input/output circuit 150 may include a sampling circuit 1210 and a register 1220. During data training, the sampling circuit 1210 samples each of the data signals DQ having different delay times using the data strobe signal DQS, and may store a sampling result in the register 1220 as an initial code IC. Since a data value of the initial code IC, the sampling result, varies depending on the DQS delay time, the DQS delay time be rapidly detected through a minimum sampling operation.

[SoC and DRAM Performing Data Training at High Speed]

Figure 12:
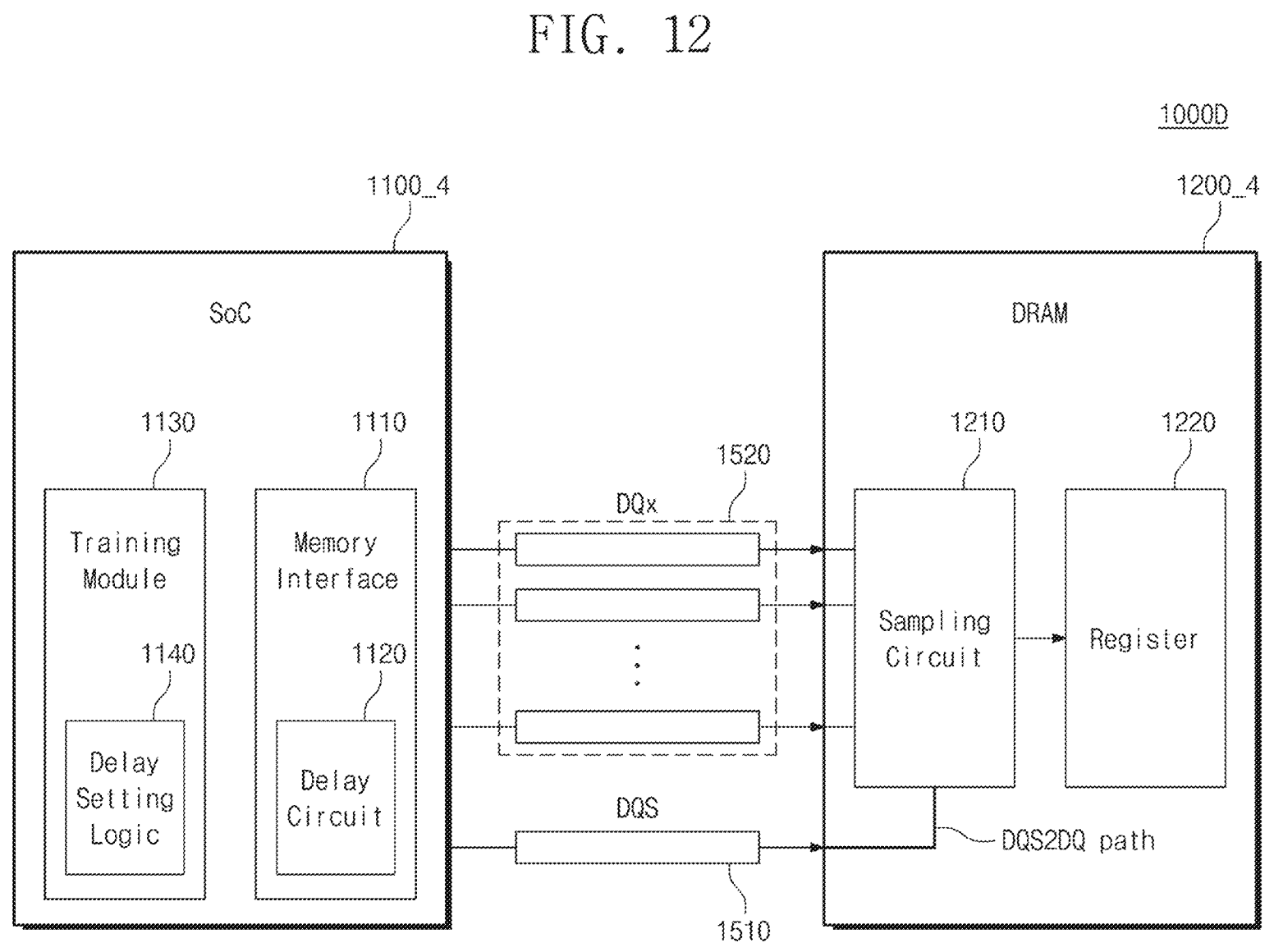

FIG. 12 is a diagram illustrating another example of the storage device of FIG. 1. For example, FIG. 12 illustrates an example in which the second chip of FIG. 1 is implemented as a DRAM and the first chip is implemented as a system-on-chip (SoC). The storage device 1000D of FIG. 12 is similar to the storage devices 1000, 1000A, and 1000B of FIGS. 1, 3, and 6. Therefore, the same or similar components are denoted by the same or similar reference numerals, and redundant descriptions will be omitted below.

Referring to FIG. 12, a storage device 1000D may include a system-on-chip 1100_4 and a DRAM 1200_4. A data strobe line 1510 and a data line 1520 for data exchange may be provided between the system-on-chip 1100_4 and the DRAM 1200_4.

The DRAM 1200_4 may be provided as a main memory of the storage device 1000D. The operating system (OS) or the application programs may be loaded into the DRAM 1200_4 when the storage device 1000D is booted up. For example, when the system-on-chip 1100_4 boots, an operating system (OS) image stored in a storage device (e.g., 1500 of FIG. 13) may be loaded into the DRAM 1200_4 based on a booting sequence. All input/output operations of the system-on-chip 1100_4 may be supported by the operating system (OS). Similarly, the application programs may be loaded into the DRAM 1200_4 to be selected by a user or to provide basic services. In addition, the DRAM 1200_4 may also be used as a buffer memory storing image data provided from a sensor such as a camera. The DRAM 1200_4 may be provided in the form of a multi-chip package or a module in which multi-chips are stacked. However, the configuration method of the DRAM 1200_4 is not limited thereto.

The system-on-chip 1100_4 may execute various applications according to a user's request. The system-on-chip 1100_4 may load an application into the DRAM 1200_4 to execute the application. The system-on-chip 1100_4 may drive the operating system (OS) and may execute various applications on the operating system (OS). For such an operation, the system-on-chip 1100_4 may write data in the DRAM 1200_4 and/or may read data stored in the DRAM 1200_4.

In at least one example embodiment, the system-on-chip 1100_4 may respectively apply different delay times to the plurality of data signals DQx, and the DRAM 1200_4 may sample the plurality of data signals DQx having different delay times using the same data strobe signal DQS. Accordingly, the DQS delay time may be rapidly detected and overall time required for data training may be reduced.

Figure 13:
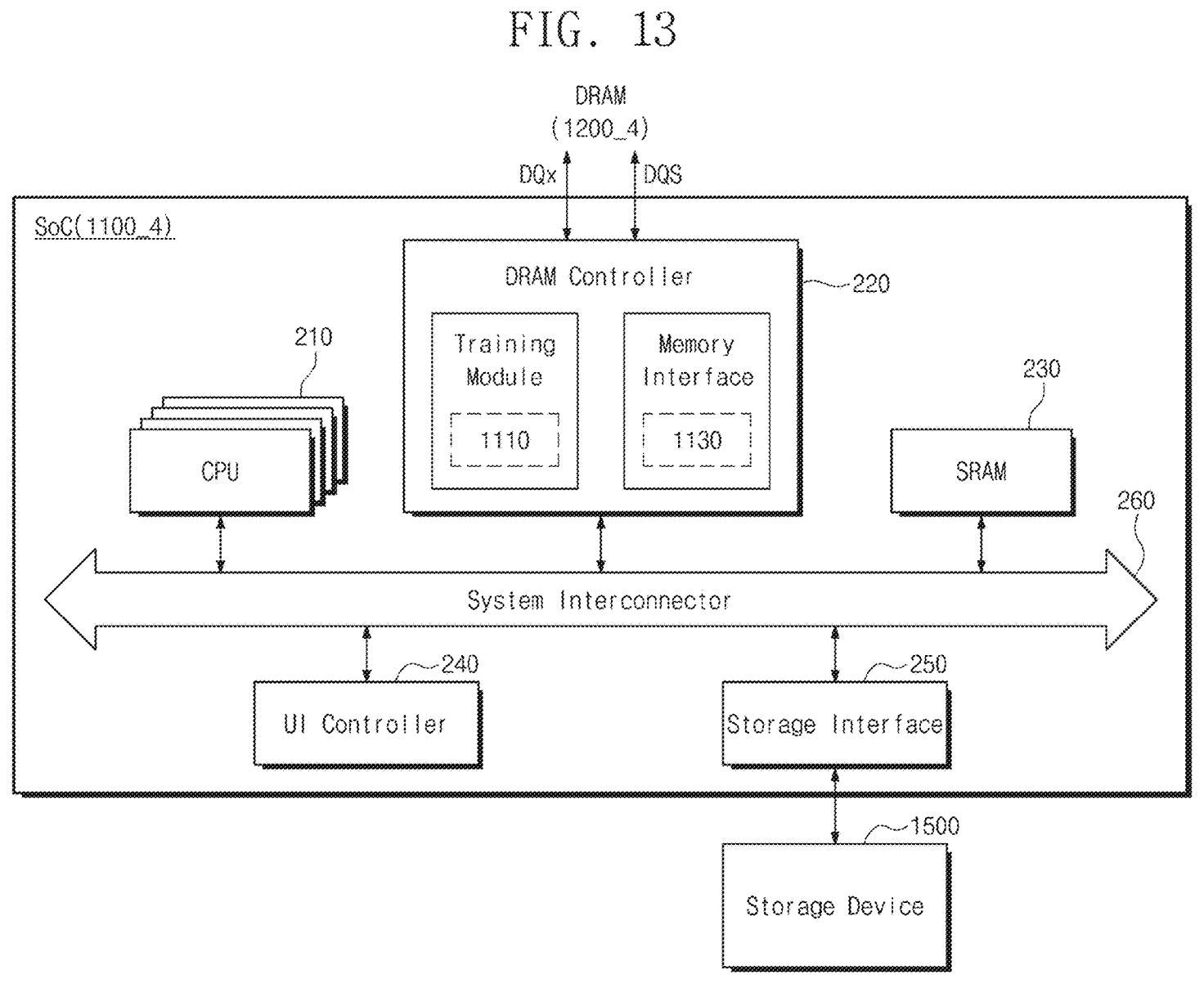

FIG. 13 is a block diagram illustrating an example of the system-on-chip of FIG. 12. Referring to FIG. 13, a system-on-chip 1100_4 may be connected to a DRAM 1200_4 and a storage device 1500. Although not illustrated, the system-on-chip 1100_4 may be connected to a device such as a liquid crystal display or a touch panel.

The system-on-chip 1100_4 may include a CPU 210, a DRAM controller 220, an SRAM 230, a user interface controller 240, a storage interface 250, and a system interconnector 260. However, this is merely an example, and components of the system-on-chip 1100_4 are not limited to the components illustrated in the drawing.

The CPU 210 may be configured to execute software (application programs, operating systems, device drivers) to be executed on the system-on-chip 1100_4. The CPU 210 may execute an operating system (OS) loaded into the DRAM 1200_4. The CPU 210 may execute various application programs to be driven based on an operating system (OS). For example, the CPU 210 may fetch and execute training codes loaded into the SRAM 230 or the DRAM 1200_4. The CPU 210 may control the DRAM controller 220 to perform a training operation of the DRAM 1200_4 requested according to the execution of the training code.

The DRAM controller 220 may be configured to provide interfacing between the DRAM 1200_4 and the system-on-chip 1100_4. The DRAM controller 220 may access the DRAM 1200_4 according to a request from the CPU 210 or another intellectual property (IP). For example, the DRAM controller 220 may write data in the DRAM 1200_4 according to a write request of the CPU 210. Alternatively, the DRAM controller 220 may read data from the DRAM 1200_4 and may transmit the read data to the CPU 210 or the storage interface 250.

The SRAM 230 may be configured as a working memory of the CPU 210. For example, a boot loader or codes may be loaded into the SRAM 230 to perform booting. For example, training codes may also be loaded into the SRAM 230 to perform data training. In addition, when the training module 1110 according to example embodiments is provided in the form of a code, the training module 1110 may be loaded into the SRAM 230.

The user interface controller 240 may be configured to receive and/or control user input and output from user interface devices (for example, a keyboard, a touch panel, or a display).

The storage interface 250 may be configured to control the storage device 1500 according to a request of the CPU 210. For example, the storage interface 250 may provide interfacing between the system-on-chip 1100_4 and the storage device 1500.

The system interconnector 260 may be a system bus providing an on-chip network in the system-on-chip 1100_4. The system interconnector 260 may include, for example, a data bus, an address bus, and a control bus.

The storage device 1500 may be provided as a storage medium of the system-on-chip 1100_4. The storage device 1500 may store application programs, an operating system image (OS Image), and various types of data. For example, a training code may be stored in a specific area of the storage device 1500 to train the DRAM 1200_4.

In at least one example embodiment, the DRAM controller 220 of the system-on-chip 1100_4 may include a training module 1110 and a memory interface 1130. Accordingly, the DRAM controller 220 may respectively apply different delay times to the plurality of data signals DQx, and may transmit the plurality of data signals DQx having the different delay times to the DRAM 1200_4.

Figure 14:
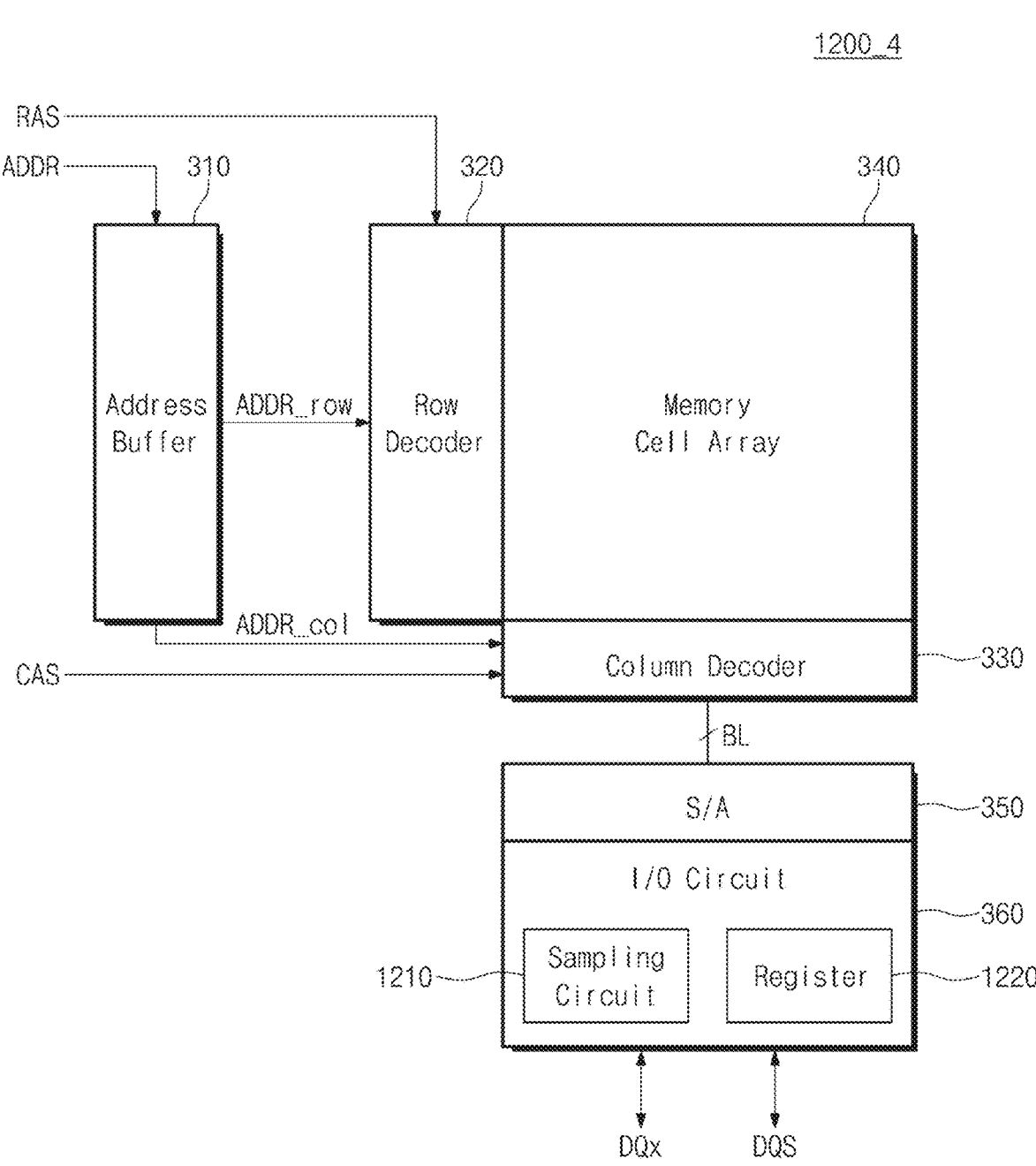
FIG. 14 is a block diagram illustrating an example of a DRAM of FIG. 12.

FIG. 14 is a block diagram illustrating an example of the DRAM 1200_4 of FIG. 12. Referring to FIG. 14, a DRAM 1200_4 may include an address buffer 310, a row decoder 320, a column decoder 330, a memory cell array 340, a sense amplifier 350, and an input/output buffer 360.

The address buffer 310 may be configured to receive the address ADDR from the DRAM controller 220. The address buffer 310 may transmit a row address ADDR_row to the row decoder 320, and may transmit a column address ADDR_col to the column decoder 330.

The row decoder 320 may be configured to select a single word line, among a plurality of worldlines connected to the memory cell array 340, in response to the row address ADDR_row.

The column decoder 330 may be configured to select a single bit line, among a plurality of bit lines BL connected to the memory cell array 340, in response to the column address ADDR_col. The column decoder 330 may activate the selected bit line in response to a control signal CAS.

The memory cell array 340 may include a plurality of memory cells. Each of the plurality of memory cells may be disposed at an intersection of a plurality of word lines and a plurality of bit lines. The plurality of memory cells may be connected to a plurality of word lines and a plurality of bit lines. In at least one embodiment, each of the plurality of memory cells may be provided in a matrix form. The plurality of word lines may be connected to rows of memory cells of the memory cell array 340. The plurality of bit lines may be connected to columns of memory cells of the memory cell array 340.

The memory cell array 340 may include, for example, dynamic random access memory (DRAM), synchronous DRAM (SDRAM), double date rate SDRAM (DDR SDRAM), DDR2 SDRAM, and DDR3 SDRAM cells. However, this is merely an example, and the memory cells of the memory cell array 340 may be provided as random access memory (RAM) cells such as phase-change RAM (PRAM), magnetic RAM (MRAM), resistive RAM (RRAM), static RAM (SRAM) cells, and/or the like.

The sense amplifier 350 may be connected to a plurality of bit lines connected to the memory cell array 340. The sense amplifier 350 may be configured to sense a voltage variation of an activated bit line, among the plurality of bit lines, and may amplify and output the voltage variation.

The input/output buffer 360 may output data to an external device through data lines DQ based on the voltage amplified from the sense amplifier 350.

In at least one example embodiment, the input/output buffer 360 may include a sampling circuit 1210 and a register 1220. The input/output buffer 360 may sample a plurality of data signals DQx having different delay times using the same data strobe signal DQS, and may store the sampled data signals DQx in the register 1220. Accordingly, the DQS delay time may be rapidly detected, and the overall time required for data training may be reduced.

[Interface Circuit Supporting High-Speed Data Training]

Figure 15:
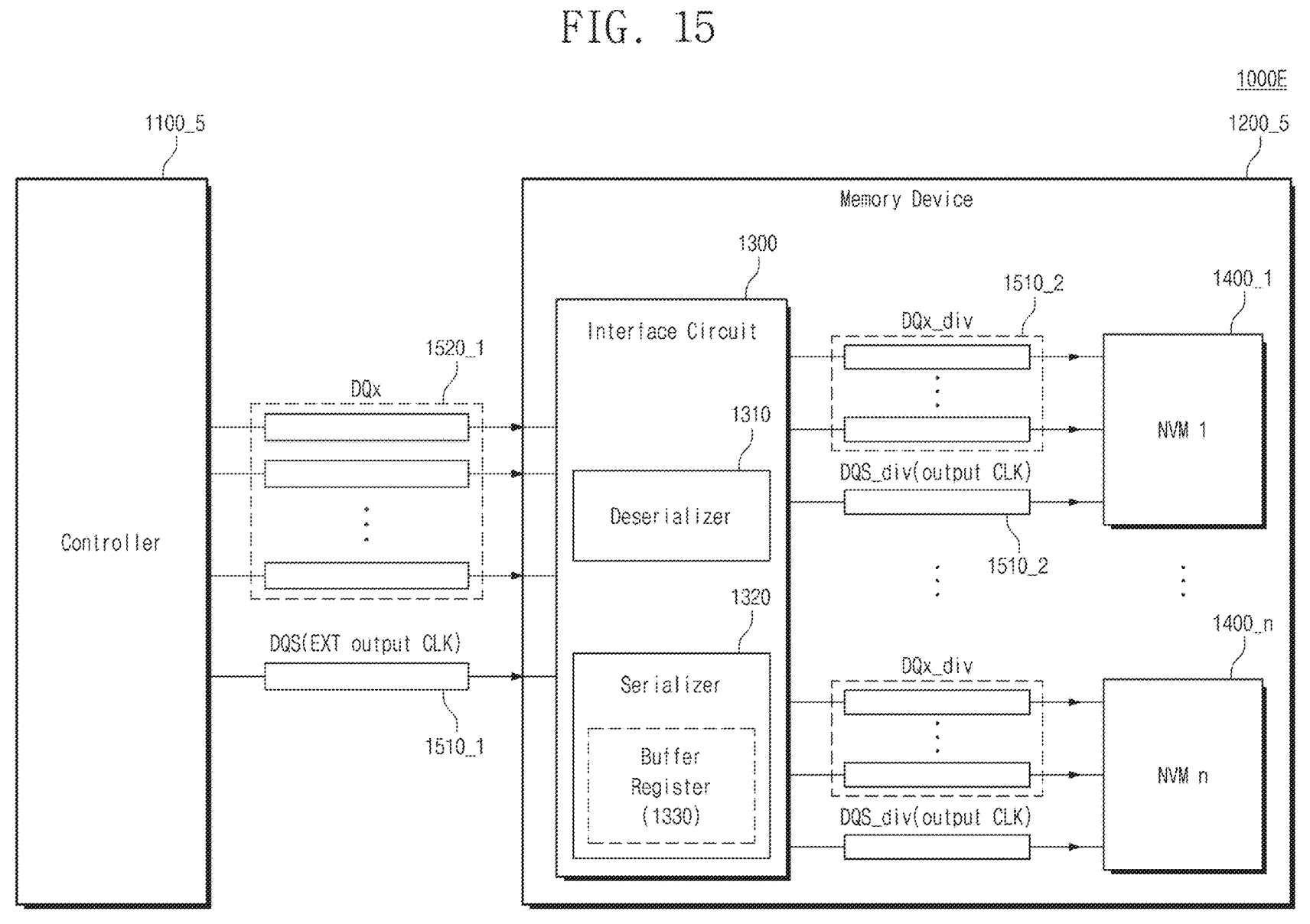

FIG. 15 is a diagram illustrating another example of the storage device of FIG. 1. For example, in FIG. 15, the interface circuit 1300 may operate as the first chip of FIG. 1 and/or the second chip of FIG. 1. A storage device 1000E of FIG. 15 is otherwise similar to the storage devices 1000, 1000A, and 1000B of FIGS. 1, 3, and 6. Therefore, the same or similar components are denoted by the same or similar reference numerals, and redundant descriptions will be omitted below.

Referring to FIG. 15, the storage device 1000E may include a controller 1100_5 and a memory device 1200_5. The memory device 1200_5 may include an interface circuit 1300 and a plurality of nonvolatile memories 1400_1 to 1400_n. A first data strobe line 1510_1 and a first data line 1520_1 for data exchange may be provided between the controller 1100_5 and the interface circuit 1300. In addition, a second data strobe line 1510_2 and a second data line 1520_2 for data exchange may be provided on the interface circuit 1300 and each of the nonvolatile memories 1400_1 to 1400_n.

The controller 1100_5 may write data in the plurality of nonvolatile memories 1400_1 to 1400_n in response to a write request, or may receive data from the plurality of nonvolatile memories 1400_1 to 1400_n in response to a read request.

Each of the plurality of nonvolatile memories 1400_1 to 1400_n may store data requested to be written, or may read stored data. One of the plurality of nonvolatile memories 1400_1 to 1400_n may include memory cells of a nonvolatile memory such as a flash memory, an RRAM, a PRAM, an MRAM, an FRAM, or an STT-RAM.

The interface circuit 1300 may provide interfacing between the plurality of nonvolatile memories 1400_1 to 1400_n and the controller 1100_5.

In at least one example embodiment, the interface circuit 1300 may perform a buffering operation to compensate for a difference in operating speeds between the controller 1100_5 and the nonvolatile memories 1400_1 to 1400_n. Since the interface circuit 1300 performs a buffering operation, the interface circuit 1300 may be referred to as a buffer chip or a buffer circuit.

During the buffer operation, a frequency when data is exchanged between the controller 1100_5 and the interface circuit 1300 may be different from a frequency when data is exchanged between the interface circuit 1300 and the nonvolatile memories 1400_1 to 1400_n. For example, a frequency between the controller 1100_5 and the interface circuit 1300 may be higher than a frequency between the interface circuit 1300 and the nonvolatile memories 1400_1 to 1400_n. For example, a frequency of a first DQS signal 1510_1 corresponding to an external clock signal EXT CLK may be higher than a frequency of a second DQS signal 1510_2 corresponding to an internal clock signal INT CLK.

In at least one example embodiment, the interface circuit 1300 may receive data signals DQx from the controller 1100_5 and may divide and write data, included in the data signals DQx, in the nonvolatile memories 1400_1 to 1400_n. To this end, the interface circuit 1300 may include a deserializer 1310 dividing write data received from the controller 1100_5. In these cases, a frequency of a divided data strobe signal DQS_div corresponding to the internal clock signal INT CLK may be lower than a frequency of the data strobe signal DQS corresponding to the external clock signal EXT CLK. For example, when the write data is divided and written in n nonvolatile memories, the frequency of the divided data strobe signal DQS_div may be 1/n times the frequency of the data strobe signal DQS.

Also, in at least one example embodiment, the interface circuit 1300 may receive the divided data signals DQx_div from the plurality of nonvolatile memories 1400_1 to 1400_n, and may combine pieces of read data, included in the divided data signals DQx_div, and transmit the combined pieces of read data to the controller 1100_5. To this end, the interface circuit 1300 may include a serializer 1320 combining pieces of read data received from the plurality of nonvolatile memories 1400_1 to 1400__n_. In these cases, the frequency of the divided data strobe signal DQS_div may be lower than the frequency of the data strobe signal DQS.

Data training according to example embodiments may be applied between the controller 1100_5 and the interface circuit 1300. Also, the data training according to example embodiments may be applied between the interface circuit 1300 and the plurality of nonvolatile memories 1400_1 to 1400__n_. Accordingly, the data training in the storage device 1000E may be rapidly performed.

Figure 16:
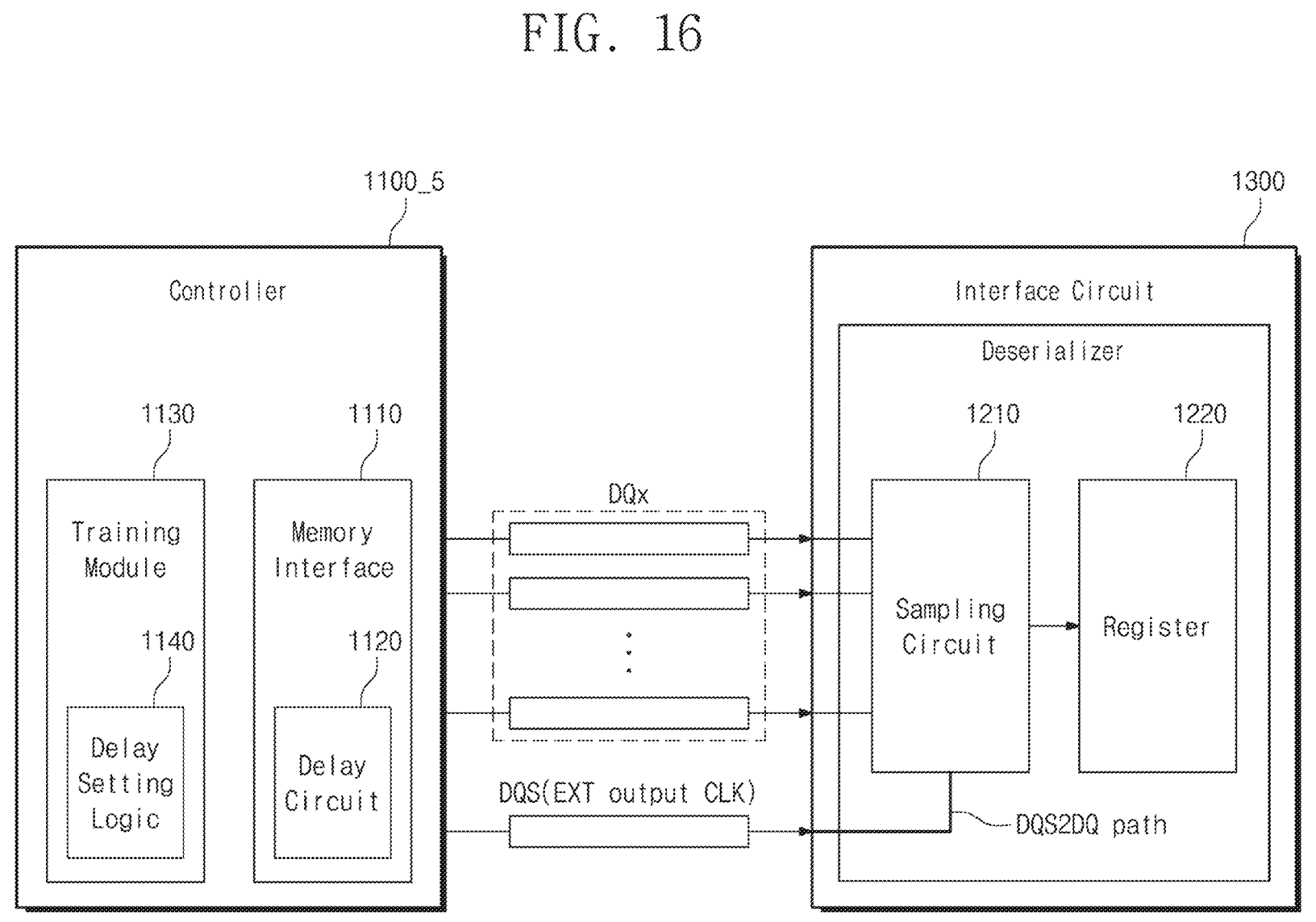

FIG. 16 is a diagram provided to describe the data training between the controller 1100_5 and the interface circuit 1300 in the storage device 1000E of FIG. 15.

Referring to FIG. 16, the controller 1100_5 may include a training module 1110 and a memory interface 1130. The controller 1100_5 may respectively apply different delay times to the plurality of data signals DQx, and may transmit the plurality of data signals DQx having the different delay times to the interface circuit 1300 through a first data line 1520_1. In these cases, the data strobe signal DQS corresponding to the external clock EXT CLK may be transmitted together through a first data strobe line 1510_1.

The deserializer 1310 of the interface circuit 1300 may include a sampling circuit 1210 and a register 1220. The interface circuit 1300 may sample the plurality of data signals DQx having different delay times using the same data strobe signal DQS. Accordingly, time required for data training between the controller 1100_5 and the interface circuit 1300 may be reduced.

Figure 17:
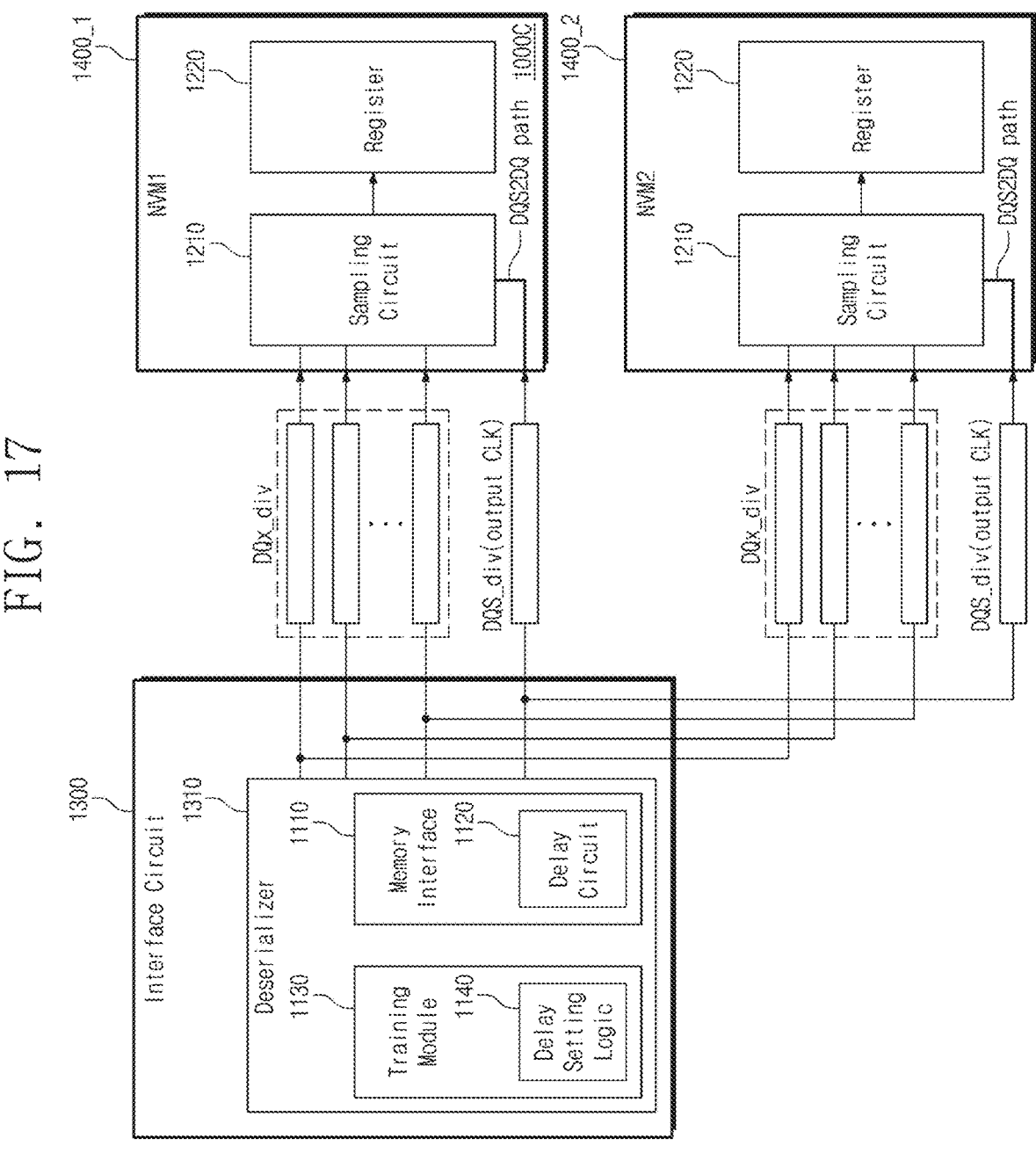
FIG. 17 is a diagram provided to describe data training between an interface circuit and nonvolatile memories in the storage device of FIG. 15.

FIG. 17 is a diagram provided to describe the data training between the interface circuit 1300 and the nonvolatile memories 1400_1 and 1400_2 in the storage device 1000E of FIG. 15. For ease of description, in FIG. 17, it will be assumed that data is divided and written in two nonvolatile memories 1400_1 and 1400_2.

Referring to FIG. 17, the deserializer 1310 of the interface circuit 1300 may include a training module 1110 and a memory interface 1130. The interface circuit 1300 may respectively apply different delay times to the plurality of data signals DQx, and may divide and transmit the plurality of data signals DQx having the different delay times to the first nonvolatile memory 1400_1 and the second nonvolatile memory 1400_2. In these cases, the divided data strobe signal DQS_div corresponding to the internal clock INT CLK may be transmitted to the first nonvolatile memory 1400_1 together with the first divided data signals DQx_div1.

Similarly, the divided data strobe signal DQS_div may be transmitted to the second nonvolatile memory 1400_2 together with the second divided data signals DQx_div2. Since data is divided and written in the two nonvolatile memories 1400_1 and 1400_2, a frequency of the divided data strobe signal DQS_div corresponding to the internal clock INT CLK may be ½ times a frequency of the signal DQS corresponds to the external clock EXT CLK.

Each of the first and second nonvolatile memories 1400_1 and 1400_2 may include a sampling circuit 1210 and a register 1220. The first nonvolatile memory 1400_1 may sample the first divided data signals DQx_div1 having different delay times using the divided data strobe signal DQS_div. The second nonvolatile memory 1400_2 may sample the second divided data signals DQx_div2 having different delay times using the divided data strobe signal DQS_div.

Figure 18A:
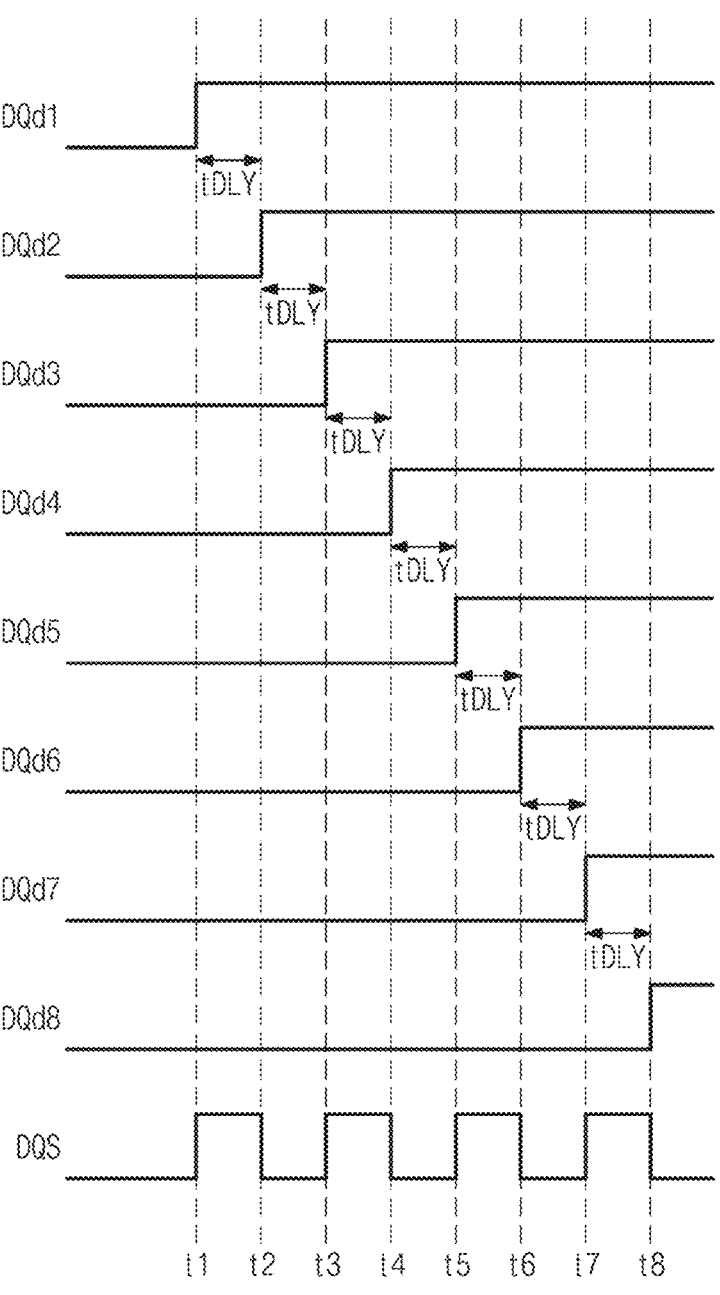
FIGS. 18A and 18B include diagrams provided to describe interfacing between the interface circuit and the first nonvolatile memory of FIG. 17.
Figure 18B:
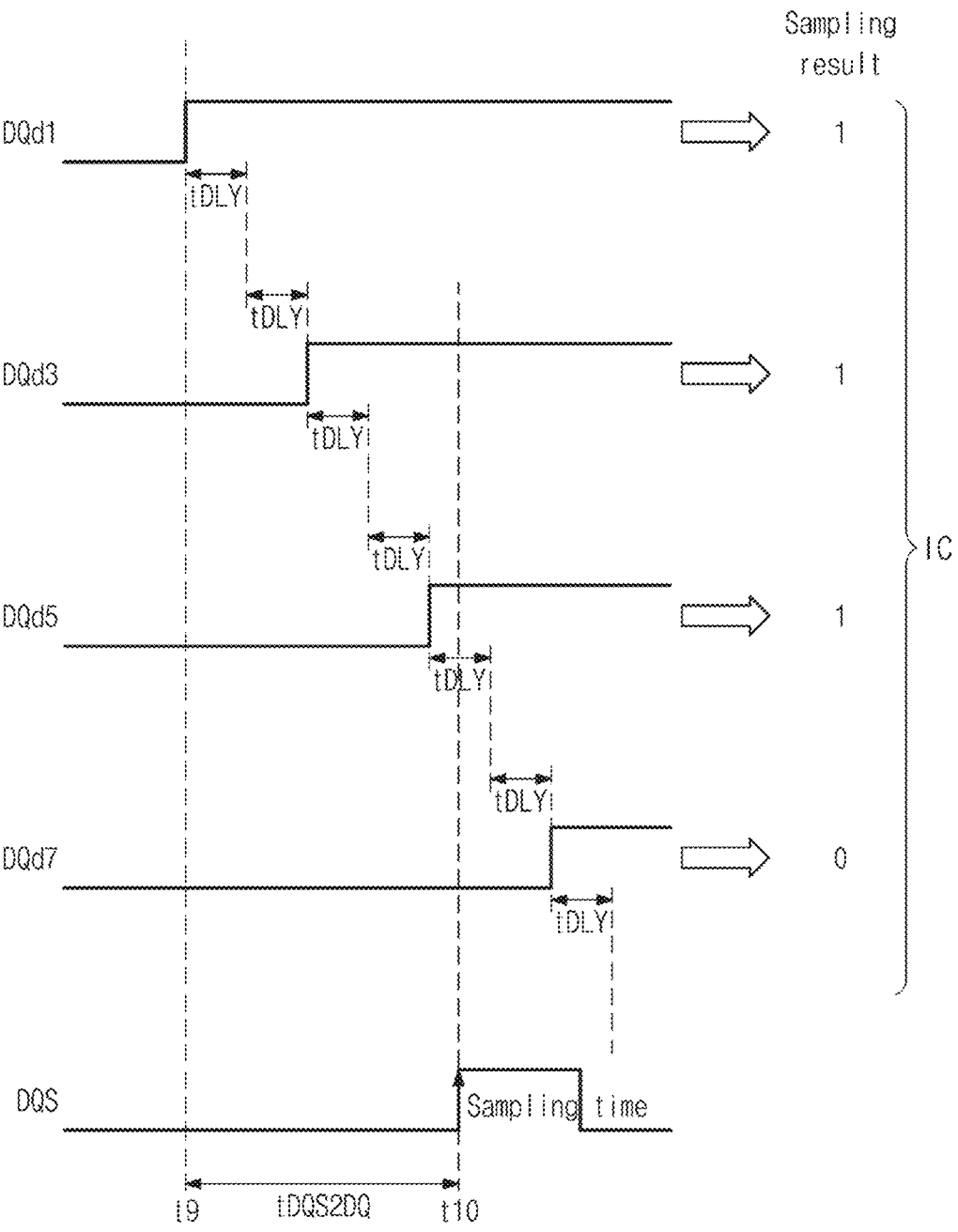

FIGS. 18A and 18B include diagrams provided to describe the interfacing between the interface circuit 1300 of FIG. 17 and the first nonvolatile memory 1400_1. For example, FIG. 18A illustrates an example of data signals delayed by different delay times by the interface circuit 1300, and FIG. 18B illustrates an example of first divided data DQx_div1 sampled by the first nonvolatile memory 1400_1.

Referring to FIG. 18A, during data training, the first to eighth data signals DQ1 to DQ8 may be sequentially delayed at a unit time interval tDLY. In these cases, rising edges of the first to eighth data signals DQ1 to DQ8 may be synchronized with a rising edge and a falling edge of the data strobe signal DQS, the external clock signal EXT_CLK.

Referring to FIG. 18B, among the first to eighth delayed data signals DQd1 to DQd8, some data signals DQd1, DQd3, DQd5, and DQd7 may be received by the first nonvolatile memory 1400_1. Although not illustrated, the remaining data signals DQd2, DQd4, DQd6, and DQd8 may be received by the second nonvolatile memory 1400_2.

The first nonvolatile memory 1400_1 may sample the delayed data signals DQd1, DQd3, DQd5, and DQd7 using the divided data strobe signal DQS_div. In these cases, a time interval between adjacent data signals may correspond to two unit delay times (for example, 2*tDLY). In addition, a frequency of the divided data strobe signal DQS_div may be ½ times a frequency of the data strobe signal DQS, the external clock signal EXT_CLK. A sampling result may be stored in the register 1220 as an initial code IC.

As illustrated in FIGS. 18A and 18B, the delayed data signals DQd1 to DQd8 are divided and written in the first and second nonvolatile memories 1400_1 and 1400_2, so that a delay interval between the adjacent data signals received by each of the nonvolatile memories 1400_1 and 1400_2 may be greater than a delay interval applied by the interface circuit 1300. Accordingly, a range of the detected DQS delay time may be further widened.

In these cases, in at least one example embodiment, the data training in the fine mode described in FIGS. 6 to 8B may be additionally performed in data training between the interface circuit 1300 and the nonvolatile memories 1400_1 and 1400_2. Accordingly, the DQS delay time may be more accurately detected.

In addition, in at least one example embodiment, a size of the unit delay time set by the interface circuit 1300 during data training between the interface circuit 1300 and the nonvolatile memories 1400_1 and 1400_2 may be smaller than a size of the unit delay time set by the controller 1100_5 during data training between the controller 1100_5 and the interface circuits 1300. For example, the lower the frequency corresponding to the divided data strobe signal DQS_div, the smaller the size of the unit delay time set by the interface circuit 1300. Accordingly, the DQS delay time may be more accurately detected.

The terms used in the present specification may be replaced with various other terms. For example, terms such as DQS flight time and WCK2DQ time tWCK2DQ may be used rather than DQS delay time, a term indicating time taken by a DQS2DQ path. In addition, a term such as fly by-topology may be used rather than an unmatched interface type. In addition, the data training method of detecting and compensating for a skew caused by a DQS delay time according to example embodiments may be referred to as a write leveling training mode.

As described, a storage device according to example embodiment may perform a training operation at high speed.

While example embodiments have been shown and described above, it will be apparent to those skilled in the art that modifications and variations could be made without departing from the scope of the present inventive concept as defined by the appended claims.

What is claimed is:

1. A storage device comprising:
a first chip; and
a second chip configured to exchange data with the first chip,
wherein the first chip is configured to transmit a data strobe signal and a plurality of data signals to the second chip such that different delay times are applied to each of the plurality of data signals, and
the second chip is configured to, during data training, sample the plurality of data signals using the data strobe signal received from the first chip,
the data training including a coarse mode and a fine mode,
the second chip is configured to generate a coarse initial code based on a sampling result in the coarse mode,
the first chip is configured to determine a coarse data strobe signal (DQS) delay time based on the coarse initial code and to apply the coarse DQS delay time to the data strobe signal in the fine mode, and
the first chip is configured to additionally apply the coarse DQS delay time to the plurality of data signals in the fine mode.

2. The storage device of claim 1, wherein the first chip comprises processing circuitry configured to
apply a first delay time to a first data signal to output a first delayed data signal, and
apply a second delay time, longer than the first delay time, to a second data signal to output a second delayed data signal.

3. The storage device of claim 2, wherein
the first chip further comprises processing circuitry configured to apply a third delay time, longer than the second delay time, to a third data signal to output a third delayed data signal, and
a time interval between the first delayed data signal and the second delayed data signal and a time interval between the second delayed data signal and the third delayed data signal are equal to each other.

4. The storage device of claim 2, wherein the second chip comprises:
a first sampler configured to sample the first delayed data signal using the data strobe signal, and
a second sampler configured to sample the second delayed data signal using the data strobe signal.

5. The storage device of claim 4, wherein the second chip further comprises a register configured to store, as an initial code, at least an output value of the first sampler and an output value of the second sampler.

6. The storage device of claim 4, wherein the second chip comprises:
a first pad corresponding to the first sampler and configured to receive the first delayed data signal, and
a second pad configured to receive the data strobe signal, and
wherein a length of a path from the first pad to the first sampler is smaller than a length of a path from the second pad to the first sampler.

7. The storage device of claim 1, wherein the first chip comprises processing circuitry configured to
set a course delay time of the data training in the coarse mode,
set a fine delay time of the data training in the fine mode, apply a first delay time to a first data signal and to apply a second delay time to a second data signal based on the course delay time set in the coarse mode, and
apply a third delay time, shorter than the first delay time, to the first data signal and apply a fourth delay time, shorter than the second delay time, to the second data signal based on the fine delay time in the fine mode.

8. The storage device of claim 1, wherein the second chip comprises a nonvolatile memory configured to store data transmitted from the first chip.

9. The storage device of claim 1, wherein the second chip comprises a dynamic random access memory (DRAM) configured to store data transmitted from the first chip.

10. The storage device of claim 1, further comprising:
a plurality of third chips configured to exchange data with the second chip,
wherein the second chip is configured to transmit a divided data strobe signal to the plurality of third chips, during the data training, such that the divided data strobe signal has a frequency lower than a frequency of the data strobe signal.

11. The storage device of claim 10, wherein the second chip is configured to
apply a first delay time to a first data signal to generate a first delayed data signal and to apply a second delay time, longer than the first delay time, to a second data signal to generate a second delayed data signal,
divide and transmit the first delayed data signal to the plurality of third chips, and
divide and transmit the second delayed data signal to the plurality of third chips.

12. The storage device of claim 11, wherein the first chip is configured to
apply a third delay time to a third data signal, of the plurality of data signals, to generate a third delayed data signal and
apply a fourth delay time, longer than the third delay time, to a fourth data signal, of the plurality of data signals, to generate a fourth delayed data signal, and
wherein a time interval between the first delayed data signal and the second delayed data signal is shorter than a time interval between the third delayed data signal and the fourth delayed data signal.

13. A storage device comprising:
a controller; and
a memory device configured to exchange data with the controller and comprising an interface circuit and a plurality of nonvolatile memories,
wherein the controller is configured to transmit a plurality of first data signals and a first data strobe signal to the interface circuit during first data training, each of the plurality of first data signals applied with a different delay time,
the interface circuit is configured to transmit a plurality of second data signals and a second data strobe signal to the plurality of nonvolatile memories during second data training, each of the plurality of second data signals applied with a different delay time, and
a frequency of the second data strobe signal is lower than a frequency of the first data strobe signal.

14. The storage device of claim 13, wherein the controller comprises:
a first delay circuit comprising a plurality of delay cells, the first delay circuit configured to delay initial data signals to generate the plurality of first data signals, and controller processing circuitry configured to determine a data strobe signal (DQS) delay time for the first data strobe signal based on a first initial code received from the interface circuit.

15. The storage device of claim 14, wherein the interface circuit comprises:

a first sampling circuit configured to sample the plurality of first data signals using the first data strobe signal, and a first register configured to store a sampling result value of the first sampling circuit as the first initial code.

16. The storage device of claim 15, wherein the interface circuit comprises:

a second delay circuit comprising a plurality of delay cells and configured to delay the initial data signals to generate the plurality of second data signals, and interface processing circuitry configured to determine a data strobe signal (DQS) delay time for the second data strobe signal based on a second initial code received from the plurality of nonvolatile memories.

17. The storage device of claim 16, wherein at least one of the plurality of nonvolatile memories comprises:

a second sampling circuit configured to sample the plurality of second data signals using the second data strobe signal, and a second register configured to store a sampling result value of the second sampling circuit as the second initial code.

18. The storage device of claim 13, wherein the plurality of second data signals comprise at least a first delayed data signal with a first delay time and a second delayed data signal with a second delay time, the second delay time longer than the first delay time, the plurality of nonvolatile memories comprises a first nonvolatile memory and a second nonvolatile memory, and the interface circuit transmits a portion of data, included in the plurality of second data signals, to the first nonvolatile memory and transmits another portion of the data, included in the plurality of second data signals, to the second nonvolatile memory.

19. The storage device of claim 18, wherein the plurality of first data signals comprises at least a third delayed data signal with third delay time, and a fourth delayed data signal with fourth delay time, longer than the third delay time, and a time interval between the first delayed data signal and the second delayed data signal is shorter than a time interval between the third delayed data signal and the fourth delayed data signal.

* * * * *